US011502696B2

(12) United States Patent
Mathuriya et al.

(10) Patent No.: US 11,502,696 B2
(45) Date of Patent: Nov. 15, 2022

(54) IN-MEMORY ANALOG NEURAL CACHE

(71) Applicant: Intel Corporation, Santa Clara, CA (US)

(72) Inventors: Amrita Mathuriya, Portland, OR (US); Sasikanth Manipatruni, Portland, OR (US); Victor Lee, Santa Clara, CA (US); Huseyin Sumbul, Portland, OR (US); Gregory Chen, Portland, CA (US); Raghavan Kumar, Hillsboro, OR (US); Phil Knag, Hillsboro, OR (US); Ram Krishnamurthy, Portland, OR (US); Ian Young, Portland, OR (US); Abhishek Sharma, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 982 days.

(21) Appl. No.: 16/160,800

(22) Filed: Oct. 15, 2018

(65) Prior Publication Data
US 2019/0057304 A1 Feb. 21, 2019

(51) Int. Cl.
*H03M 1/00* (2006.01)
*H03M 1/12* (2006.01)
(Continued)

(52) U.S. Cl.
CPC ............ *H03M 1/12* (2013.01); *G06N 3/0445* (2013.01); *G06N 3/0481* (2013.01); *G06N 3/063* (2013.01); *G06N 3/0635* (2013.01); *G06N 3/08* (2013.01)

(58) Field of Classification Search
CPC ..... H03M 1/12; G06N 3/0445; G06N 3/0481; G06N 3/063; G06N 3/0635; G06N 3/08
(Continued)

(56) References Cited

U.S. PATENT DOCUMENTS 10,705,967 B2 * 7/2020 Mathuriya ............... G06N 3/04
10,872,290 B2 * 12/2020 Goulding ................. G06N 3/04
(Continued)

OTHER PUBLICATIONS

Eckert, et al. (2018). Neural Cache: Bit-Serial In-Cache Acceleration of Deep Neural Networks. 45th ACM/IEEE International Symposium on Computer Architecture (ISCA), May 9, 2018, 14 pages.
(Continued)

*Primary Examiner* — Jean B Jeanglaude
(74) *Attorney, Agent, or Firm* — Trop, Pruner & Hu, P.C.

(57) ABSTRACT

Embodiments are directed to systems and methods of implementing an analog neural network using a pipelined SRAM architecture ("PISA") circuitry disposed in on-chip processor memory circuitry. The on-chip processor memory circuitry may include processor last level cache (LLC) circuitry. One or more physical parameters, such as a stored charge or voltage, may be used to permit the generation of an in-memory analog output using a SRAM array. The generation of an in-memory analog output using only word-line and bit-line capabilities beneficially increases the computational density of the PISA circuit without increasing power requirements. Thus, the systems and methods described herein beneficially leverage the existing capabilities of on-chip SRAM processor memory circuitry to perform a relatively large number of analog vector/tensor calculations associated with execution of a neural network, such as a recurrent neural network, without burdening the processor circuitry and without significant impact to the processor power requirements.

25 Claims, 18 Drawing Sheets

(51) Int. Cl.
    *G06N 3/063*     (2006.01)
    *G06N 3/04*     (2006.01)
    *G06N 3/08*     (2006.01)

(58) Field of Classification Search
    USPC .......................................................... 341/126
    See application file for complete search history.

(56) References Cited

U.S. PATENT DOCUMENTS

| | | | |
|---|---|---|---|
| 11,055,613 B2 * | 7/2021 | Ma ........................ | G06F 7/5443 |
| 11,151,046 B2 * | 10/2021 | Mathuriya ................ | G06F 8/41 |
| 2019/0056885 A1 * | 2/2019 | Mathuriya ............ | G06F 3/0683 |
| 2019/0057300 A1 * | 2/2019 | Mathuriya ............... | G06N 3/04 |
| 2019/0057304 A1 * | 2/2019 | Mathuriya .............. | H03M 1/12 |

OTHER PUBLICATIONS

Unpublished—U.S. Appl. No. 16/160,466, filed Oct. 15, 2018.
Unpublished—U.S. Appl. No. 16/160,482, filed Oct. 15, 2018.
Unpublished—U.S. Appl. No. 16/160,270, filed Oct. 15, 2018.

\* cited by examiner

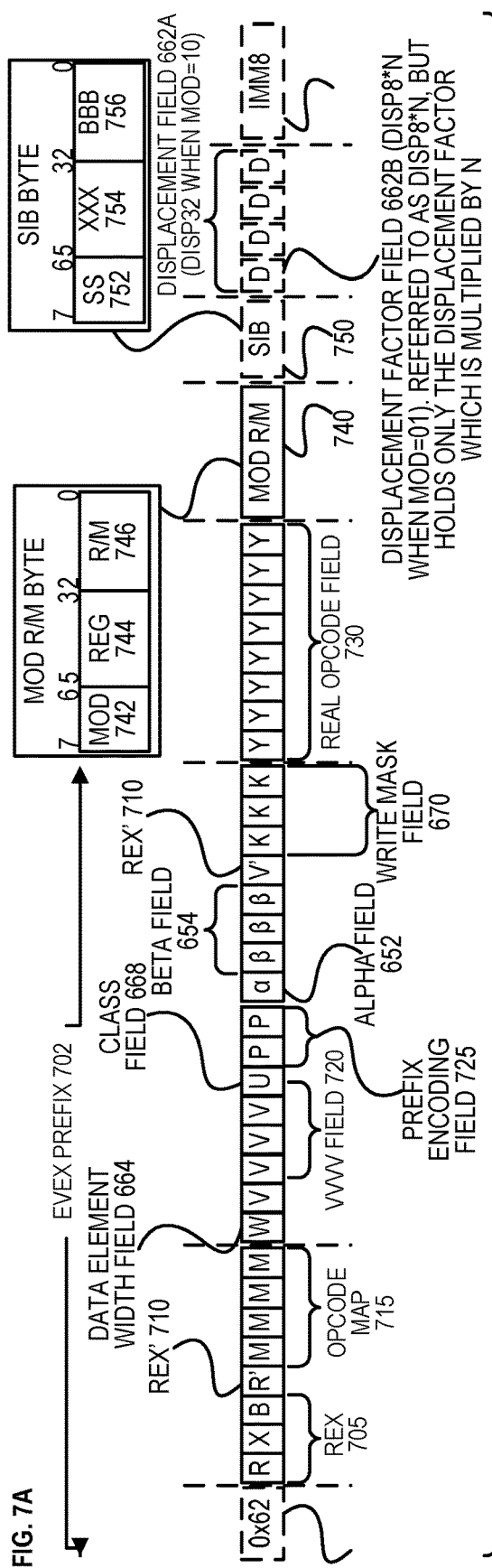
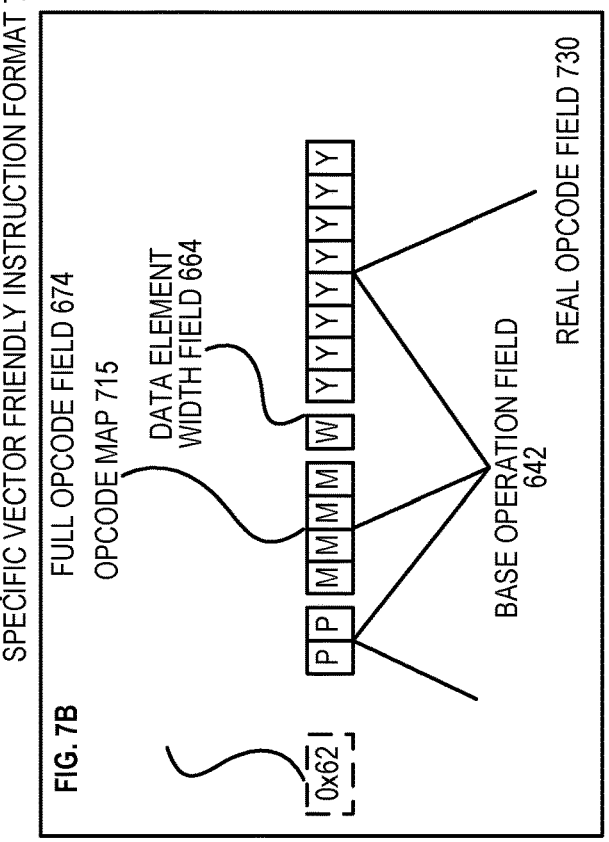
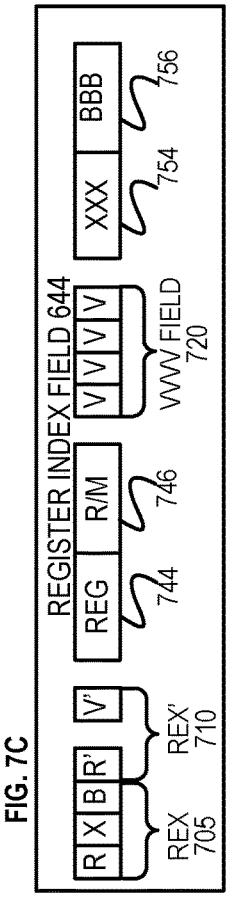
FIG. 7A
FIG. 7B
FIG. 7C

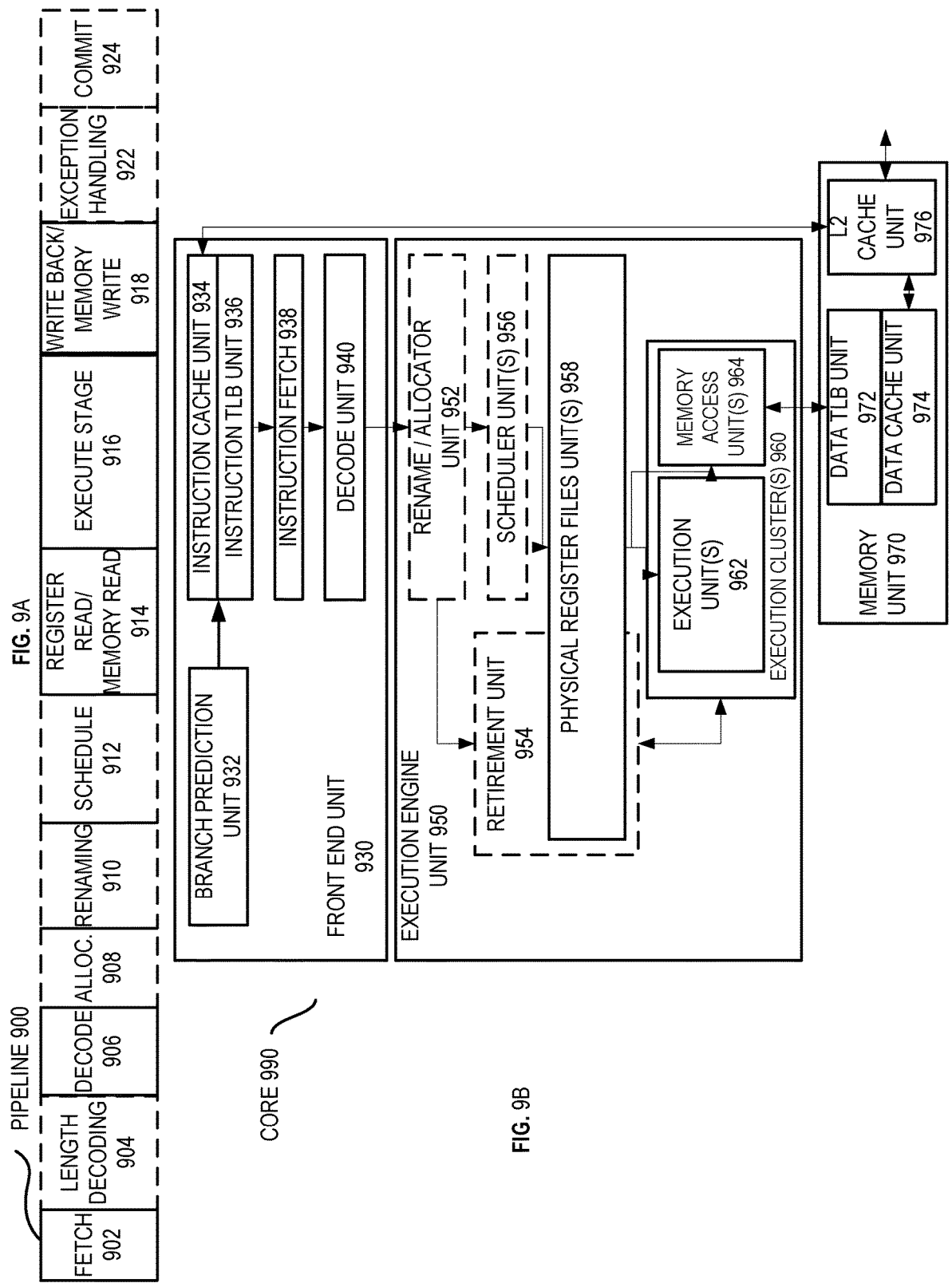

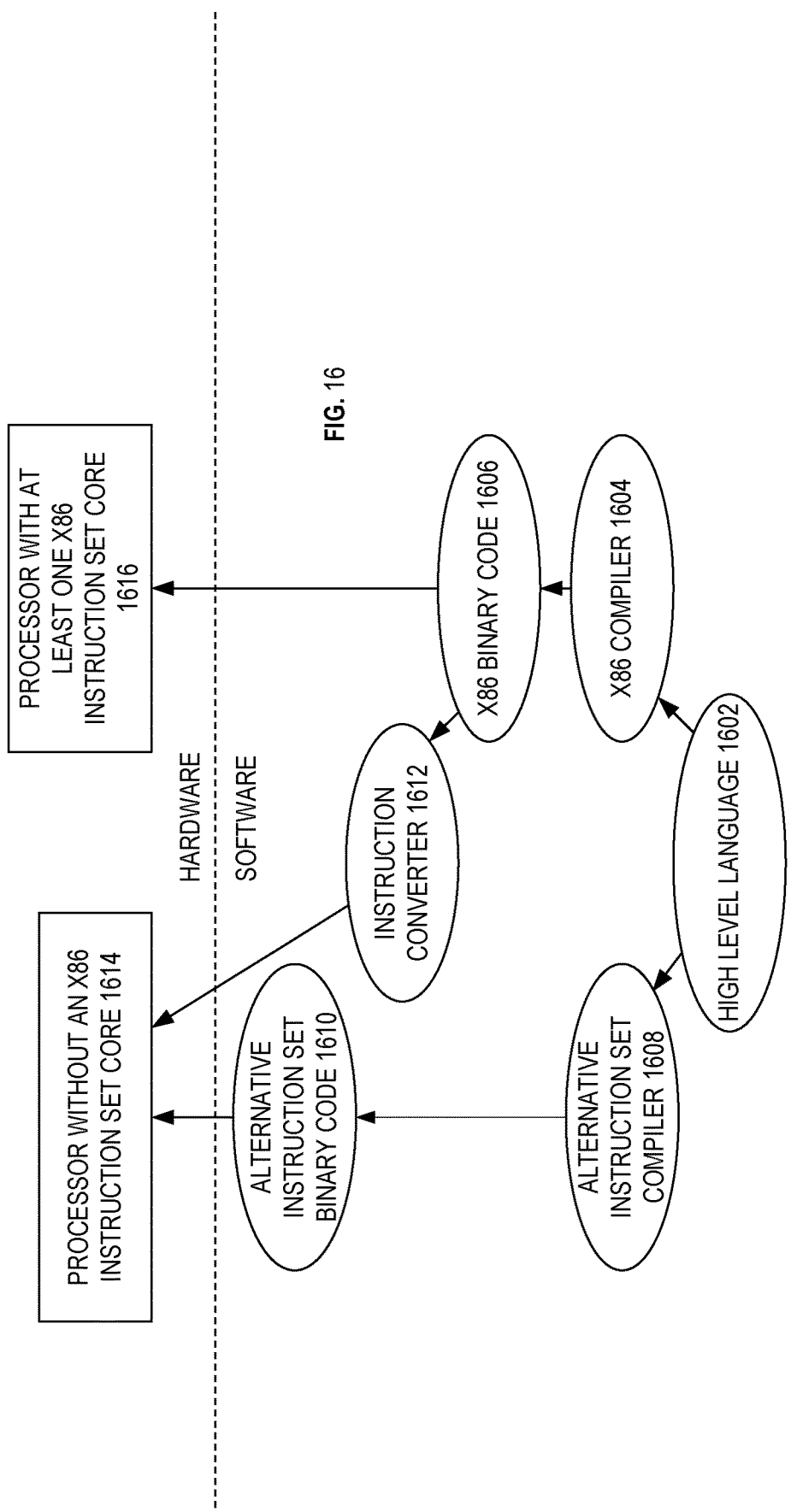

IN-MEMORY ANALOG NEURAL CACHE

TECHNICAL FIELD

The present disclosure relates to processor architecture that features in-memory computation capability within on-chip processor memory.

BACKGROUND

Recognizing that data transfer rates from storage such as a magnetic or solid-state storage device is relatively slow, in-memory processing relies upon the transfer of data relevant to a decision-making process from such storage devices to system memory having a comparatively much higher data transfer rate. In memory processing is particularly useful in applications where relatively large quantities of intermediate decision-making data are generated. Such intermediate decision-making data is frequently written to storage then retrieved for subsequent processing. Neural networks, such as recursive neural networks may generate a large volume of intermediate data that is passed from layer to layer within the network. In addition, each layer may rely upon weight factors that are retrieved from data storage and, in the case of recursive neural networks updated and written to data storage. With an increasing dependence on graphics intensive processing using smaller form factor portable and mobile-platform processor-based devices, the ability to perform fixed or floating point mathematical operations using in-memory processing improves speed, efficiency an accuracy of neural network.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIGS. 7A-D are block diagrams illustrating an exemplary specific vector friendly instruction format according to embodiments of the invention;

FIG. 9A is a block diagram illustrating both an exemplary in-order pipeline and an exemplary register renaming, out-of-order issue/execution pipeline according to embodiments of the invention.

FIG. 9B is a block diagram illustrating both an exemplary embodiment of an in-order architecture core and an exemplary register renaming, out-of-order issue/execution architecture core to be included in a processor according to embodiments of the invention;

FIG. 16 is a block diagram contrasting the use of a software instruction converter to convert binary instructions in a source instruction set to binary instructions in a target instruction set according to embodiments of the invention.

Figure 1:
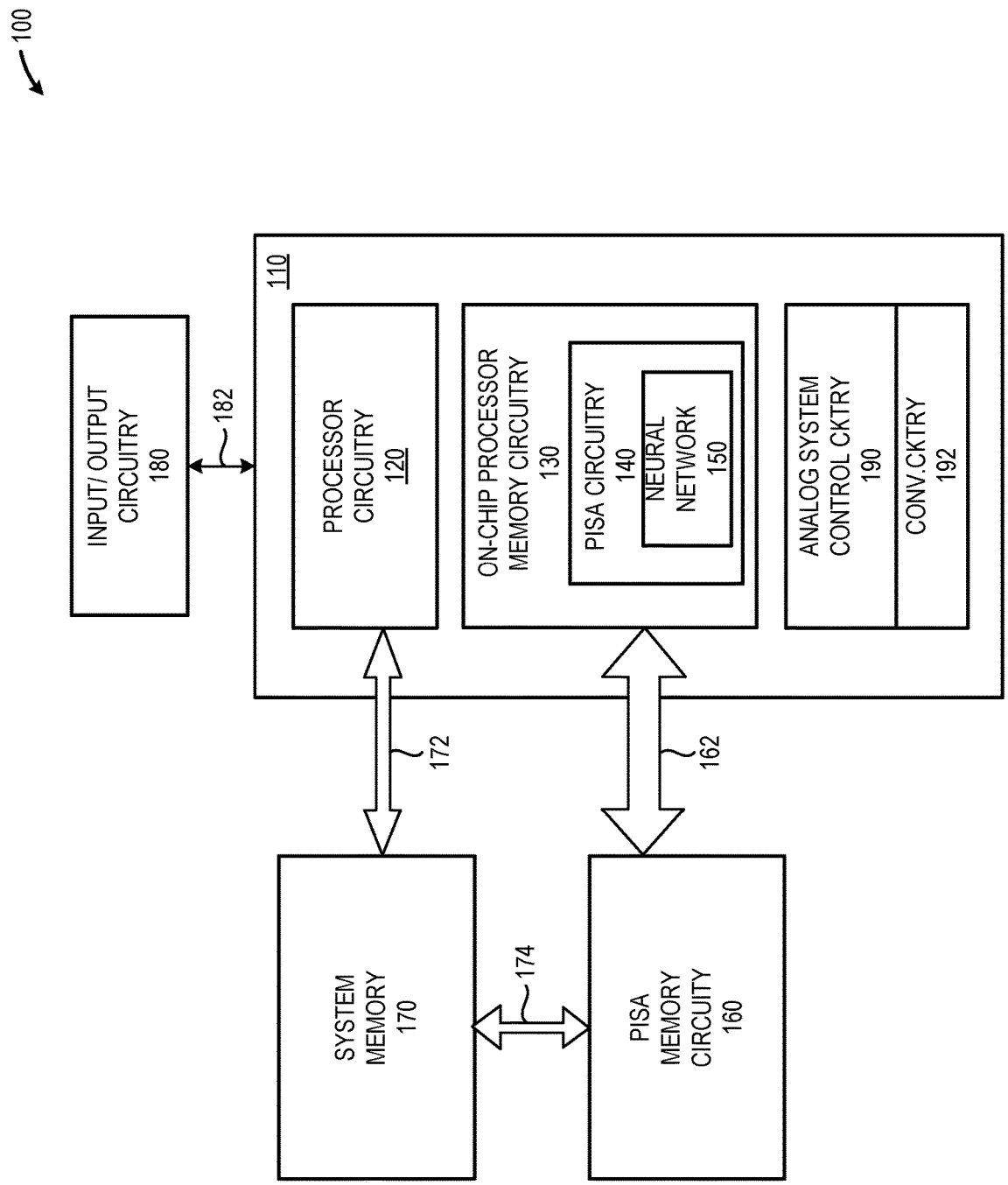
FIG. 1 is a block diagram of an illustrative system in which a semiconductor package includes processor circuitry and on-chip processor memory incorporating pipelined static random access memory architecture circuitry (hereinafter, "PISA circuitry") capable of performing analog, in-memory, mathematical operations associated with a multi-layer neural network, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

Recurrent neural networks process information sequentially, each layer of the neural network receives information (as input) from the preceding layer and passes along (as output) information to the subsequent neural network layer. Each of the layers included in the recurrent neural network incorporate all of the preceding information into the current calculation (e.g., information determined from $t_0$ to $t_{n-1}$ into the decision making at time=$t_n$). Recurrent neural networks have demonstrated success in many non-linear programming tasks. Recurrent neural networks are flexible and find use in language modeling and generating text, machine translation, speech recognition, and object location and identification.

Given the relatively large tensors generated by a recurrent neural network, the mathematical burden placed on processors is significant—slowing the output of the network. While delayed output may be acceptable in some situations, in many situations, such as object detection and avoidance in autonomous vehicles, an output delay is unacceptable and potentially hazardous. While expanding processor bandwidth by increasing clock speeds or multiplying the number of processing cores provide a potential solution, such solutions are costly and may increase the size and/or power consumption of a portable electronic device.

Another solution involves the use of memory to perform in-memory processing. For example, performing in-situ vector arithmetic operations within static random access memory (SRAM) arrays. The resulting architecture provides massive parallelism by repurposing thousands, or even more, of SRAM arrays into vector computation units. However, while such SRAM arrays are beneficial, overall network speed and computational efficiency are compromised by the sheer number of memory operations needed to support the implementation of the recurrent neural network.

The systems and methods described herein beneficially and advantageously increase the speed and efficiency of a neural cache implementation by taking advantage of the ability to assign values other than a binary value such as "0" or "1" to a memory cell by measuring the voltage during a cache read operation and converting the voltage to a multi-bit value. For example, simply apportioning or quantizing the read voltage into two ranges permits a two-bit analog resolution. Even greater analog resolution may be accomplished by apportioning or quantizing the read voltage into an even greater number of ranges. In such a manner, 3-bit, 4-bit, or even greater analog resolution may be achieved. Such an analog implementation beneficially and advantageously increases the computational efficiency of a neural network implemented in processor cache memory without requiring a proportionately greater allocation of SRAM memory in the cache.

The systems and methods described herein provide for an in-memory, analog neural network implementation that beneficially improves the computational efficiency of an in-memory implementation by permitting a single memory cell to provide 2-bit, 3-bit, or even 4-bit data values rather than a 1-bit, "0" or "1" value. In embodiments, the read voltage of a memory cell may be apportioned or quantized into a plurality of ranges. As the number of voltage ranges increases, the number of bits of data allocated to the respective memory cell similarly increases. The analog neural network systems and methods described herein are applicable to virtually any neural network, and are particularly beneficial for implementing in-memory recurrent neural networks. In embodiments, power may be applied to multiple write lines (e.g., 4 write lines) and the voltage values from a number of memory cells may be summed along a single bit line to provide the voltage value which is then converted from an analog value to a multi-bit digital value using an analog-to-digital (A/D) converter. In embodiments, the systems and methods described herein may include one or more circuits (e.g., a cross-bit line processor circuit) to compare the digital value to a threshold value and provide the neural network output data.

In particular, rather than (or in addition to) reading the binary state of an SRAM memory cell (e.g., a logical "0" or "1"), systems and methods consistent with this disclosure enable reading one or more analog parameters, such as voltage, capacitance, inductance, and/or charge, associated with the SRAM memory cell to determine the corresponding charge level of the cell and use the charge level to represent information. For example, a range of possible charges may be broken into subranges, each subrange corresponding to a value (e.g., a minimum charge may correspond to "0" while a maximum charge may correspond to "8"). In this way, a memory cell can effectively store two kinds of information simultaneously: a 1-bit value (represented by an on/off state of the cell as with most memory cells) as well as a partially independent 4-bit value (represented by the analog voltage and/or charge of the cell itself). This enables systems to perform analog computations using both types of information at significantly improved rates.

A system to implement a neural network and execute analog operations associated with the neural network in SRAM on-chip processor memory circuitry is provided. The system may include: processor circuitry; analog to digital (A/D) conversion circuitry; on-chip processor memory circuitry that includes a plurality of static random access memory (SRAM) circuits, each of the SRAM circuits including microcontroller circuitry; and control circuitry to: form a serially coupled pipelined SRAM architecture (PISA) circuit by serially coupling the SRAM circuits included in the plurality of SRAM circuits, each of the SRAM circuits to determine a single layer of a multi-layer neural network; cause the PISA circuit to generate an analog output that includes a voltage representative of an output of the multi-layer neural network; cause the A/D conversion circuitry to convert the analog output to a digital output representative of the output of the multi-layer neural network; and compare the digital output representative of the output of the multi-layer neural network to one or more threshold values.

A method to cause pipelined, serially coupled, SRAM on-chip processor memory circuitry arrays to implement and perform analog neural network tensor or matrix operations is provided. The method may include: forming, by control circuitry, a serially coupled pipelined SRAM architecture (PISA) circuit by serially coupling a plurality of SRAM circuits included in on-chip processor cache circuitry, each of the SRAM circuits to provide an output representative of a single layer of a multi-layer neural network; causing, by the control circuitry, the PISA circuit to generate an analog output that includes a voltage representative of an output of the multi-layer neural network; causing, by the control circuitry, an analog to digital (A/D) conversion circuit to convert the analog output to a digital output representative of the output of the multi-layer neural network; and causing, by the control circuitry, a comparison of the digital output representative of the output of the multi-layer neural network to one or more threshold values.

A system to implement a neural network and execute analog operations associated with the neural network in SRAM on-chip processor memory circuitry is provided. The system may include: means for forming a serially coupled pipelined SRAM architecture (PISA) circuit by serially coupling a plurality of SRAM circuits included in on-chip processor cache circuitry, each of the SRAM circuits to provide an output representative of a single layer of a multi-layer neural network; means for causing the PISA circuit to generate an analog output that includes a voltage representative of an output of the multi-layer neural network; means for converting the analog output to a digital output representative of the output of the multi-layer neural network; and means comparing of the digital output representative of the output of the multi-layer neural network to one or more threshold values.

A non-transitory machine-readable storage medium that includes instructions that, when executed cause pipelined, serially coupled, SRAM on-chip processor memory circuitry arrays to implement and perform analog neural network tensor or matrix operations is provided. The instructions, when executed by a control circuit cause the control circuit to: form a serially coupled pipelined SRAM architecture (PISA) circuit by serially coupling the SRAM circuits included in the plurality of SRAM circuits, each of the SRAM circuits to determine a single layer of a multi-layer neural network; cause the PISA circuit to generate an analog output that includes a voltage representative of an output of the multi-layer neural network; cause the A/D conversion circuitry to convert the analog output to a digital output representative of the output of the multi-layer neural network; and compare the digital output representative of the output of the multi-layer neural network to one or more threshold values.

An electronic device that includes pipelined, serially coupled, SRAM on-chip processor memory circuitry arrays to implement and perform analog neural network tensor or matrix operations is provided. The electronic device may include: a circuit board; a processor circuit coupled to the circuit board; a system memory circuit coupled to the circuit board and communicably coupled to the processor circuit; analog to digital (A/D) conversion circuitry; on-chip processor memory circuitry that includes a plurality of static random access memory (SRAM) circuits, each of the SRAM circuits including microcontroller circuitry; and control circuitry to: form a serially coupled pipelined SRAM architecture (PISA) circuit by serially coupling the SRAM circuits included in the plurality of SRAM circuits, each of the SRAM circuits to determine a single layer of a multi-layer neural network; cause the PISA circuit to generate an analog output that includes a voltage representative of an output of the multi-layer neural network; cause the A/D conversion circuitry to convert the analog output to a digital output representative of the output of the multi-layer neural network; and compare the digital output representative of the output of the multi-layer neural network to one or more threshold values.

As used herein, the term "on-chip" or elements, components, systems, circuitry, or devices referred to as "on-chip" include such items integrally fabricated with the processor circuitry (e.g., a central processing unit, or CPU, in which the "on-chip" components are included, integrally formed, and/or provided by CPU circuitry) or included as separate components formed as a portion of a multi-chip module (MCM) or system-on-chip (SoC).

As used herein, the terms "on-chip processor memory circuitry," "processor cache" and "cache circuitry" refer to cache memory present within a processor or central processing unit (CPU) package. While such processor cache is typically collocated with the central processing unit circuitry, as used herein the terms should be construed to include any memory capable of providing a processor cache, for example a separate processor cache chip packaged as a multi-chip module (MCM) or similar. Such processor cache may variously be referred to, and should be considered to include, without limitation, Level 1 (L1) cache, Level 2 (L2) cache, Level 3 (L3) cache, and/or last or lowest level cache (LLC).

FIG. 1 is a block diagram of an illustrative system 100 in which a semiconductor package 110 includes processor circuitry 120 and on-chip processor memory 130 incorporating pipelined static random access memory architecture circuitry (hereinafter, "PISA circuitry") 140 capable of performing in-memory, mathematical operations associated with a multi-layer neural network 150, in accordance with at least one embodiment described herein. In embodiments, PISA memory circuitry 160 couples to the semiconductor package 110 via a relatively high-bandwidth connection 162. System memory circuitry 170 couples to the semiconductor package 110 and to the PISA memory circuitry 130 via relatively low bandwidth connections 172 and 174, respectively. Input/output (I/O) interface circuitry 180 couples to the semiconductor package 110 via one or more connections 180.

In operation, a system user provides information and/or data representative of a multi-layer neural network model and/or multi-layer neural network input data to the system 100 via the I/O interface circuitry 180. Using the supplied model and inputs, the processor circuitry 120 directly or indirectly configures the PISA circuitry 140 in the on-chip processor memory 130 to provide the multi-layer neural network 150. In embodiments, the model and/or the inputs are transferred to the on-chip processor memory 130 via direct memory access ("DMA"). The processor circuitry 120 directly or indirectly initiates or causes a transfer of the weights associated with the neural network model from the system memory circuitry 170 to the PISA memory circuitry 160. In embodiments, some or all of the neural network layer weights are transferred between the system memory circuitry 170 and the PISA memory circuitry 160 via DMA.

In embodiments, as the neural network 150 executes, the data representative of the neural network layer weights and intermediate input/output values may rapidly transfer between the on-chip processor memory circuitry 130 and the PISA memory circuitry 160 via the relatively high bandwidth connection 162. In embodiments, the PISA memory circuitry 160 is disposed in whole or in part within the on-chip processor memory circuitry 130. In other embodiments, the PISA memory circuitry 160 may be disposed proximate the semiconductor package 110, for example collocated with the semiconductor package 110 in a multi-chip module (MCM) or similar. The neural network 150 transfers output to the PISA memory circuitry 160. The use of the PISA circuitry 140 advantageously increases the speed of the neural network 150 since all or a portion of the neural network layer weights and intermediate input/output data are stored or otherwise retained in PISA memory circuitry 160 and/or in the on-chip processor memory circuitry 130. The use of the PISA circuitry 140 also beneficially enhances overall system performance since data transfers between the system memory circuitry 170 and the PISA memory circuitry 160 are accomplished via DMA.

In operation, analog calculation control circuitry 190 may obtain one or more analog parameters associated with the memory cells included in the on-chip processor memory circuitry 130 as the PISA circuitry 140 executes the neural network 150. For example, the analog calculation control circuitry 190 may obtain the one or more analog parameters resulting from the multiplication by the PISA circuitry 140 of a weight factor array with a state array associated with one or more layers of the multi-layer neural network 150. For example, the analog calculation control circuitry 190 may obtain the voltage associated with one or more SRAM memory cells that results from the multiplication by the PISA circuitry 140 of a weight factor array with a state array associated with one or more layers of the multi-layer neural network 150. In various embodiments, the one or more analog parameters may include one or more of: a voltage, a current, a charge, an inductance, and/or a capacitance associated with the respective SRAM memory cell. The analog calculation control circuitry 190 quantizes or apportions each of the one or more analog parameters to provide a multi-bit digital value. For example, the analog calculation control circuitry 190 may apportion a voltage read from an SRAM memory cell into 2 ranges to provide a 2-bit digital value, thereby doubling the data provided by a single SRAM memory cell (i.e., from a two-value binary system, to a four value, double-bit system).

The one or more analog parameters are converted from analog values to digital values using conversion circuitry 192, such as analog-to-digital (A/D) conversion circuitry. In embodiments, the analog calculation control circuitry 190 may provide all or a portion of the conversion circuitry 192. In other embodiments, the conversion circuitry 192 may include one or more stand-alone conversion circuits, such as conversion circuitry that forms a portion of a multi-chip module (MCM). After converting the one or more analog parameters to a digital value, the analog calculation control circuitry 190 compares the resultant digital value with one or more threshold values to generate one or more output values associated with the multi-layer neural network 150.

The processor circuitry 120 may include any number and/or combination of currently available and/or future developed electronic components, semiconductor devices, and/or logic elements capable of executing instructions. The processor circuitry 120 may include any of a wide variety of commercially available processors, including without limitation, an AMD® Athlon®, Duron® or Opteron® processor; an ARM® application, embedded and secure processors; an IBM® and/or Motorola® DragonBall® or PowerPC® processor; an IBM and/or Sony® Cell processor; or an Intel® Celeron®, Core (2) Duo®, Core (2) Quad®, Core i3®, Core i5®, Core i7®, Atom®, Itanium®, Pentium®, Xeon® or XScale® processor. Further, one or more of the processor circuits 120 may comprise a multi-core processor (whether the multiple cores coexist on the same or separate dies), and/or a multi-processor architecture of some other variety by which multiple physically separate processors are in some way linked.

The processor circuitry 120 may execute one or more instructions and/or may cause one or more other systems, sub-systems, modules, devices, or circuits to execute one or more instructions that cause the configuration of at least a portion of the on-chip processor memory circuitry 130 to provide the PISA circuitry 140 that provides the hardware to implement the multi-layer neural network 150. The processor circuitry 120 may receive, via the I/O interface circuitry 180, the user supplied neural network model and/or the user supplied neural network input data and convert the neural network model to an instruction set architecture ("ISA") suitable for implementation as PISA circuitry 140 formed in the on-chip processor memory circuitry 130. The processor circuitry 120 may execute instructions that directly or indirectly cause the transfer of layer weights and/or instructions executable by the PISA circuitry 140 from the system memory circuitry 170 to the PISA memory circuitry 160. The processor circuitry 120 may execute instructions that directly or indirectly cause the transfer of layer weights and/or layer input/output data between the PISA circuitry 140 and the PISA memory circuitry 160.

The on-chip processor memory 130 may include any number and/or combination of currently available and/or future developed electrical components, semiconductor devices, and/or logic elements capable of storing or otherwise retaining information and/or data. All or a portion of the on-chip processor memory circuitry 130 may be formed using static random access memory, or SRAM, circuitry. All or a portion of the on-chip processor memory circuitry 130 may include processor cache memory, such as processor last level cache (LLC) memory circuitry. The on-chip processor memory circuitry 130 stores or otherwise retains the PISA circuitry 140 that implements the neural network 150. In embodiments, the on-chip processor memory circuitry 130 may include LLC memory circuitry having a storage capacity of: 8 megabytes (MB) or less; 16 MB or less; 32 MB or less; 64 MB or less; or 128 MB or less.

In embodiments, all or a portion of the on-chip processor memory circuitry 130 may be communicably coupled to the processor circuitry 120. In other embodiments, all or a portion of the on-chip processor memory circuitry 130 may be shared between multiple processor circuits $120_1$-$120_n$. In embodiments, the on-chip processor memory circuitry 130 may store information and/or data as a cache line, for example, as a 64-byte cache line. The on-chip processor memory circuitry 130 may bidirectionally communicate information and/or data to the processor circuitry 120.

The PISA circuitry 140 includes a plurality of SRAM arrays disposed within the on-chip processor memory circuitry 130. The plurality of SRAM arrays forming the PISA circuitry 140 are communicably coupled in series to provide the input layer, output layer, and intervening hidden layers of the neural network 150. The PISA circuitry 140 may include any number and or combination of SRAM arrays, where each SRAM array provides in-memory processing for the mathematical operations associated with a single layer in the neural network 150. For example, a five layer recurrent neural network 150 (one input layer, one output layer, three hidden layers) would be represented in PISA circuitry 140 as five sequentially coupled SRAM arrays. The PISA circuitry 140 bidirectionally couples to and communicates with the PISA memory circuitry 160 via the relatively high bandwidth connection 162. In embodiments, the PISA circuitry 140 may store all or a portion of the interim data generated by one or more neural network layers (i.e., one or more SRAM arrays) in the PISA memory circuitry 160.

The PISA memory circuitry 160 includes any number and/or combination of currently available and/or future developed electrical components, semiconductor devices, and/or logic elements capable of storing or otherwise retaining information and/or data. The PISA memory circuitry 160 is communicably coupled to the PISA circuitry 140 via a bus or similar connection 162 that provides a relatively high bandwidth coupling (i.e., a coupling that provides a relatively high data transfer rate) between the PISA circuitry 140 and the PISA memory circuitry 160. The PISA memory circuitry 160 stores or otherwise retains information and/or data used by the neural network 150. Nonlimiting examples of such information and/or data include: the neural network mode; neural network weighting factors; neural network input data; neural network output data; and/or neural network intermediate data. In embodiments, the on-chip processor memory circuitry 130 provides all or a portion of the PISA memory circuitry 160. In embodiments, the PISA memory circuitry 160 may be disposed at least in part in, on, or about the semiconductor package 110. In embodiments, all or a portion of the PISA memory circuitry 160 may be off-chip, disposed external to the semiconductor package 110. In embodiments, an interconnect, such as a ring interconnect, serially interconnects at least a portion of the SRAM arrays used to provide the pipelined SRAM architecture (PISA) circuitry 140 used to implement the neural network 150.

The PISA memory 160 is communicably coupled to the system memory circuitry 170 via a bus or similar connection 174 that provides a relatively low bandwidth pathway (i.e., a relatively low data transfer rate) between the system memory circuitry 170 and the PISA memory circuitry 160. Data transfer between the system memory circuitry 170 and the PISA memory circuitry may occur via direct memory access (DMA), bypassing the processor circuitry 120 and freeing the processor circuitry 120 for other tasks. In embodiments, the PISA circuitry 140 writes the neural network output to the PISA memory circuitry 160 and transfers the neural network output via DMA to the system memory circuitry 170.

The system memory circuitry 170 may include any number and/or combination of currently available and/or future developed electronic components, semiconductor devices, and/or logic elements capable of storing or otherwise retaining information and/or data. The system memory circuitry 170 is communicably coupled to the processor circuitry 120 and/or to the semiconductor package 110 via a bus or similar connection 172 that provides a relatively low bandwidth pathway (i.e., a relatively low data transfer rate) between the system memory circuitry 170 and the processor circuitry 120 and/or to the semiconductor package 110.

The system memory circuitry 170 may be based on any of wide variety of information storage technologies, possibly including volatile technologies requiring the uninterrupted provision of electric power, and possibly including technologies entailing the use of machine-readable storage media that may be removable, or that may not be removable. Thus, the system memory circuitry 170 may include any of a wide variety of types of storage device, including without limitation, read-only memory (ROM), random-access memory (RAM), dynamic RAM (DRAM), Double-Data-Rate DRAM (DDR-DRAM), synchronous DRAM (SDRAM), static RAM (SRAM), programmable ROM (PROM), erasable programmable ROM (EPROM), electrically erasable programmable ROM (EEPROM), flash memory, polymer memory (e.g., ferroelectric polymer memory), ovonic memory, phase change or ferroelectric memory, silicon-oxide-nitride-oxide-silicon (SONOS) memory, magnetic or optical cards, one or more individual ferromagnetic disk drives, or a plurality of storage devices organized into one or more arrays (e.g., multiple ferromagnetic disk drives organized into a Redundant Array of Independent Disks array, or RAID array). It should be noted that although the system memory circuitry 170 is depicted as a single block in FIG. 1, the system memory circuitry 170 may include multiple storage devices that may be based on differing storage technologies.

The input/output interface circuitry 180 includes any number and/or combination of currently available and/or future developed electronic components, semiconductor devices, and/or logic elements capable of receiving input data from one or more input devices and/or communicating output data to one or more output devices. In embodiments, a system user provides neural network model and/or input data using one or more input devices. The user may provide the neural network model and/or input data in a high-level language that is converted by the processor circuitry 120 to an instruction set architecture (ISA) used to configure the NSA circuitry 140.

The analog calculation control circuitry 190 includes any number and/or combination of currently available and/or future developed electronic components, semiconductor devices, and/or logic elements capable of causing the PISA circuitry 140 to generate an analog output that is representative of the recurrent, multi-layer, neural network 150. The analog calculation control circuitry 190 also causes conversion circuitry 192 to convert the analog output to a multi-bit digital output. The analog calculation control circuitry 190 also compares the resultant multi-bit digital output to one or more defined threshold values. In embodiments, the one or more defined threshold values may be determined during the training of the multi-layer neural network 150. In embodiments, the processor circuitry 120 may provide all or a portion of the analog calculation control circuitry 190. In embodiments, the analog calculation control circuitry 190 may include either or both bit line processor circuitry and/or cross-bit line processor circuitry.

Figure 2:
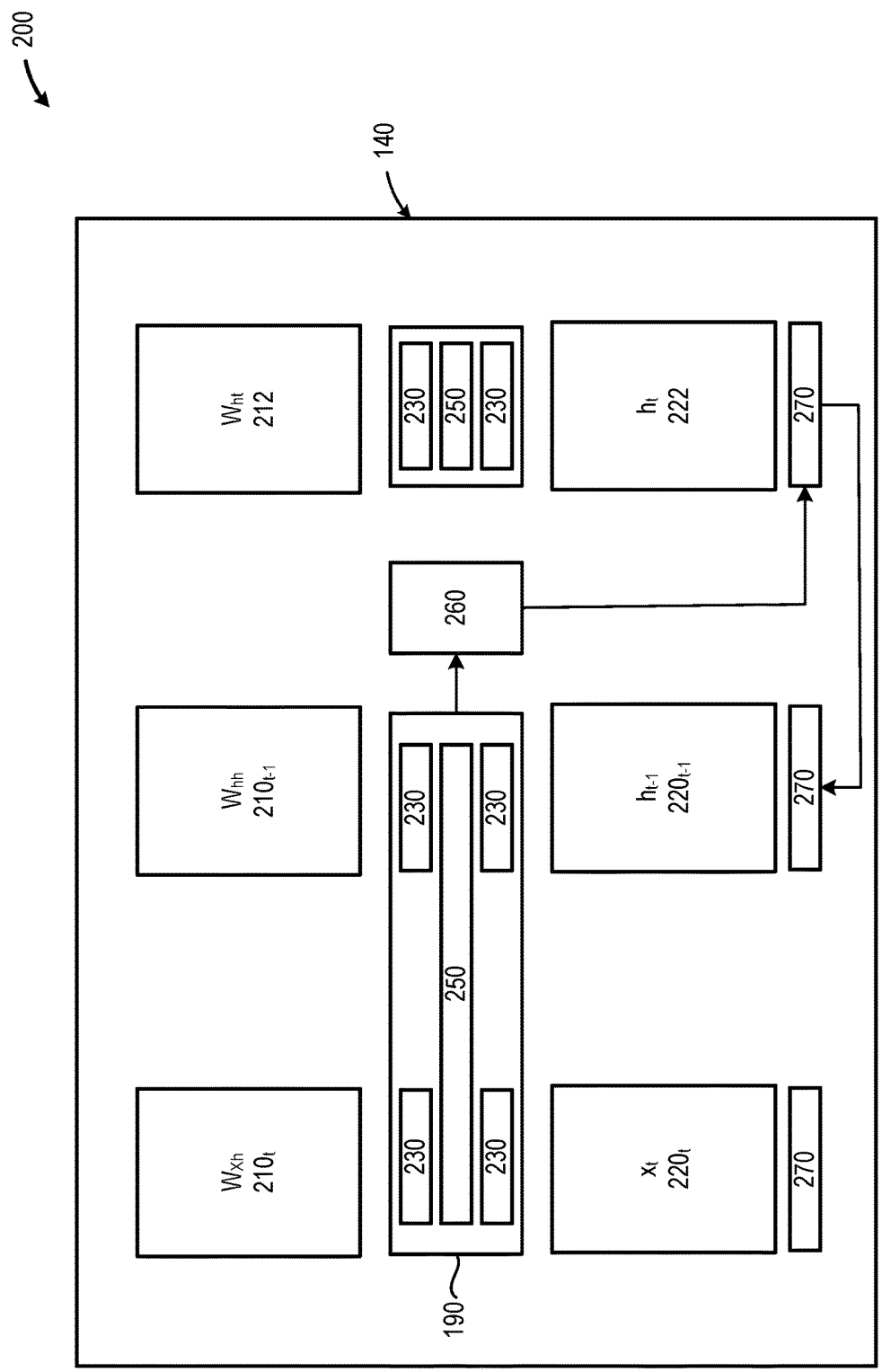
FIG. 2 is a block diagram of an illustrative system that includes PISA circuitry configured to provide an in-memory, analog, recurrent neural network ("RNN"), in accordance with at least one embodiment described herein.

FIG. 2 is a block diagram of an illustrative system 200 that includes PISA circuitry 140 configured to provide an in-memory, analog, recurrent neural network ("RNN") 150, in accordance with at least one embodiment described herein. The PISA circuitry 140 includes a plurality of SRAM array circuits 210 and 212 that store or otherwise retain one or more weight tensors. The PISA circuitry 140 further includes a plurality of SRAM array circuits 220 and 222 that store or otherwise retain one or more input tensors ($X_t$) and one or more state tensors ($h_{t-1}$ and $h_t$). As depicted in FIG. 2, the analog calculation control circuitry 190 includes one or more bit line processors 230 and one or more cross-bit line processors 250. In operation, the analog calculation control circuitry 190 causes the following tensor/matrix multiplication and addition operation to determine the current system state tensor ($h_t$):

$$h_t = (W_{xh} * X_t) + (W_{hh} * h_{t-1}) \tag{1}$$

In the recurrent neural network 150 depicted in FIG. 2, the analog calculation control circuitry 190 causes a copy or transfer operation 272 of the resultant state tensor ($h_t$) to provide the last state tensor ($h_{t-1}$). Beneficially and advantageously, the analog calculation control circuitry 190 causes the analog determination of tensor multiplication and addition by the PISA circuitry 140 using the on-chip processor memory circuitry 130. As depicted in FIG. 2, the analog calculation control circuitry 190 converts the analog values generated by the tensor/matrix multiplication and addition operation to digital values. The analog calculation control circuitry 190 then compares the resultant values with one or more defined threshold values using threshold comparison circuitry 260. In embodiments, the defined threshold values may be determined during the training process of the recurrent, multi-layer, neural network.

As an example of multi-bit processing within the PISA circuitry 140, the analog calculation control circuitry 190 may cause one or more word lines to energize and cause a discharge of the memory cells along at least one bit line to provide an analog voltage on the bit line (i.e., the sum of the voltages of the memory cells at the intersection(s) of the one or more energized word lines and the bit line). The resultant analog voltage value is representative of the multiplication of the weight array ($W_{xh}$) $210_t$ with the input array ($X_t$) $220_t$ and/or the multiplication of the weight array ($W_{hh}$) $210_{t-1}$ with the state array ($h_{t-1}$) $220_{t-1}$. In one example, four (4) word lines may be turned on and a single bit line may be discharged—in such an embodiment, the aggregate voltage from the four SRAM memory cells may be read to provide a "4-bit" value.

Figure 3:
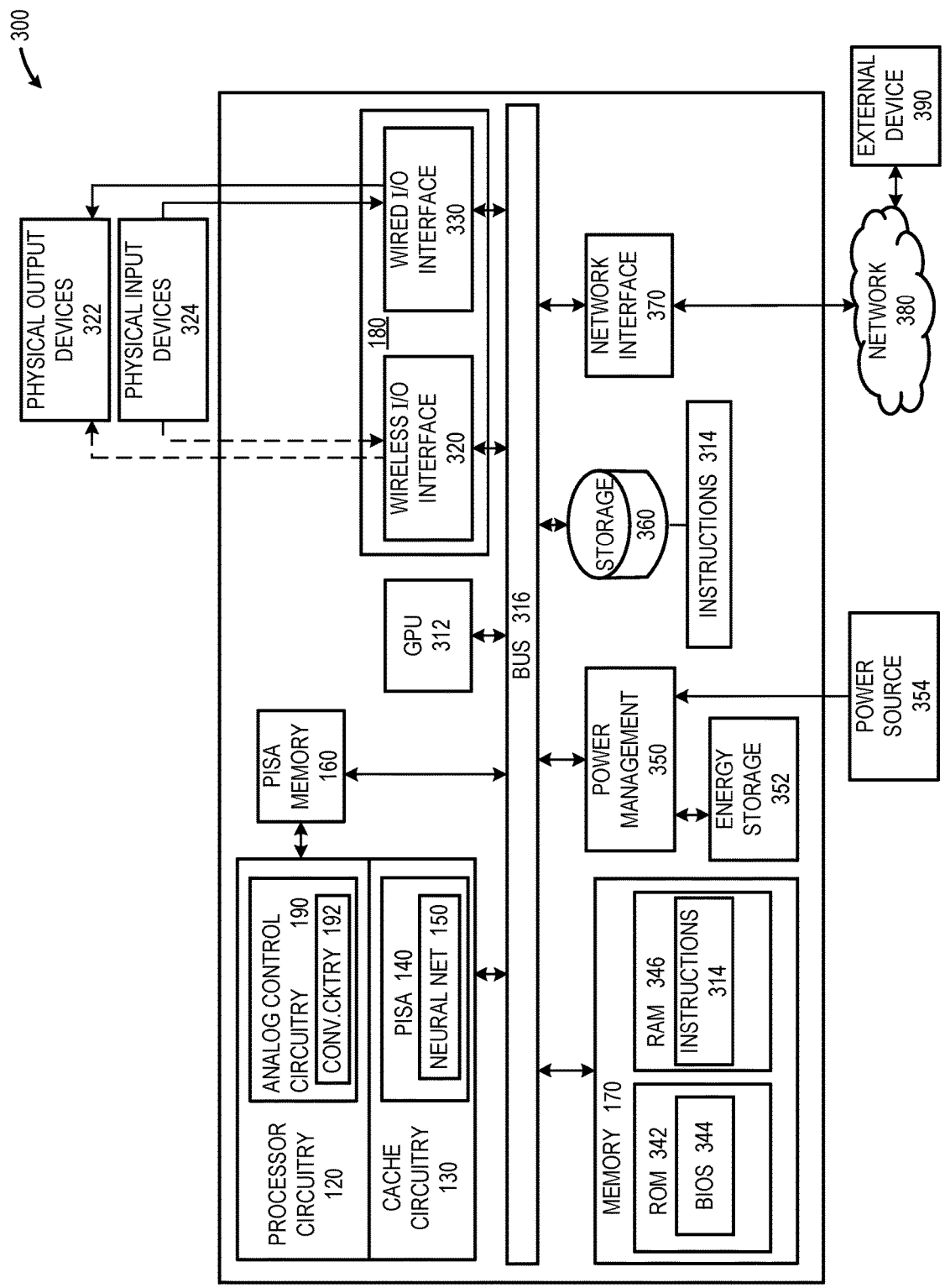
FIG. 3 is a schematic diagram of an illustrative electronic, processor-based, device that includes one or more semiconductor or multi-chip packages that contain processor circuitry and on-chip processor memory circuitry (e.g., SRAM memory such as cache memory circuitry or LLC memory circuitry) configurable to provide pipelined SRAM architecture (PISA) circuitry having analog calculation control circuitry capable of performing analog matrix operations associated with execution of a neural network in the PISA circuitry, in accordance with at least one embodiment described herein.

FIG. 3 is a schematic diagram of an illustrative electronic, processor-based, device 300 that includes one or more semiconductor or multi-chip packages 110 that contain processor circuitry 120 and on-chip processor memory circuitry 130 (e.g., SRAM memory such as cache memory circuitry or LLC memory circuitry) configurable to provide pipelined SRAM architecture (PISA) circuitry 140 having analog calculation control circuitry 190 capable of performing analog matrix operations associated with execution of a neural network 150 in the PISA circuitry 140, in accordance with at least one embodiment described herein. The processor-based device 300 may additionally include one or more of the following: a graphical processing unit 312, a wireless input/output (I/O) interface 320, a wired I/O interface 330, system memory 170, power management circuitry 350, a non-transitory storage device 360, and a network interface 370. The following discussion provides a brief, general description of the components forming the illustrative processor-based device 300. Example, non-limiting processor-based devices 300 may include, but are not limited to: smartphones, wearable computers, portable computing devices, handheld computing devices, desktop computing devices, servers, blade server devices, workstations, and similar.

In some embodiments, the processor-based device 300 includes graphics processor circuitry 312 capable of executing machine-readable instruction sets and generating an output signal capable of providing a display output to a system user. Those skilled in the relevant art will appreciate that the illustrated embodiments as well as other embodiments may be practiced with other processor-based device configurations, including portable electronic or handheld electronic devices, for instance smartphones, portable computers, wearable computers, consumer electronics, personal computers ("PCs"), network PCs, minicomputers, server blades, mainframe computers, and the like. The processor circuitry 120 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions.

The processor-based device 300 includes a bus or similar communications link 316 that communicably couples and facilitates the exchange of information and/or data between various system components including the processor circuitry 120, the graphics processor circuitry 312, one or more wireless I/O interfaces 320, one or more wired I/O interfaces 330, the system memory 170, one or more storage devices 360, and/or one or more network interfaces 370. The processor-based device 300 may be referred to in the singular herein, but this is not intended to limit the embodiments to a single processor-based device 300, since in certain embodiments, there may be more than one processor-based device 300 that incorporates, includes, or contains any number of communicably coupled, collocated, or remote networked circuits or devices.

The processor circuitry 120 may include any number, type, or combination of currently available or future developed devices capable of executing machine-readable instruction sets. The processor circuitry 120 may include but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 3 are of conventional design. Consequently, such blocks need not be described in further detail herein, as they will be understood by those skilled in the relevant art. The bus 316 that interconnects at least some of the components of the processor-based device 300 may employ any currently available or future developed serial or parallel bus structures or architectures.

In embodiments, the processor circuitry 120 and the on-chip processor memory circuitry 130 are disposed in a semiconductor package 110. In embodiments, the semiconductor package 110 may have any size, shape, or geometry—for example, the semiconductor package 110 may include a multi-chip module (MCM) containing a plurality of interconnected, individual, semiconductor packages. The semiconductor package 110 may additionally include the analog calculation control circuitry 190 and/or the conversion circuitry 192. In some implementations, the processor circuitry 120 may provide all or a portion of either or both the analog calculation control circuitry 190 and/or the conversion circuitry 192. The on-chip processor memory circuitry 130 includes the PISA circuitry 140 that forms the neural network 150.

The system memory 170 may include read-only memory ("ROM") 342 and random access memory ("RAM") 346. A portion of the ROM 342 may be used to store or otherwise retain a basic input/output system ("BIOS") 344. The BIOS 344 provides basic functionality to the processor-based device 300, for example by causing the processor circuitry 120 to load and/or execute one or more machine-readable instruction sets 314. In embodiments, at least some of the one or more machine-readable instruction sets cause at least a portion of the processor circuitry 120 to provide, create, produce, transition, and/or function as a dedicated, specific, and particular machine, for example a word processing machine, a digital image acquisition machine, a media playing machine, a gaming system, a communications device, a smartphone, an autonomous vehicle control system, or similar.

The processor-based device 300 may include at least one wireless input/output (I/O) interface 320. The at least one wireless I/O interface 320 may be communicably coupled to one or more physical output devices 322 (tactile devices, video displays, audio output devices, hardcopy output devices, etc.). The at least one wireless I/O interface 320 may communicably couple to one or more physical input devices 324 (pointing devices, touchscreens, keyboards, tactile devices, etc.). The at least one wireless I/O interface 320 may include any currently available or future developed wireless I/O interface. Example wireless I/O interfaces include, but are not limited to: BLUETOOTH®, near field communication (NFC), and similar.

The processor-based device 300 may include one or more wired input/output (I/O) interfaces 330. The at least one wired I/O interface 330 may be communicably coupled to one or more physical output devices 322 (tactile devices, video displays, audio output devices, hardcopy output devices, etc.). The at least one wired I/O interface 330 may be communicably coupled to one or more physical input devices 224 (pointing devices, touchscreens, keyboards, tactile devices, etc.). The wired I/O interface 330 may include any currently available or future developed I/O interface. Example wired I/O interfaces include but are not limited to: universal serial bus (USB), IEEE 1394 ("FireWire"), and similar.

The processor-based device 300 may include one or more communicably coupled, non-transitory, data storage devices 360. The data storage devices 360 may include one or more hard disk drives (HDDs) and/or one or more solid-state storage devices (SSDs). The one or more data storage devices 360 may include any current or future developed storage appliances, network storage devices, and/or systems. Non-limiting examples of such data storage devices 360 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof.

In some implementations, the one or more data storage devices 360 may include one or more removable storage devices, such as one or more flash drives, flash memories, flash storage units, or similar appliances or devices capable of communicable coupling to and decoupling from the processor-based device 200.

The one or more data storage devices 360 may include interfaces or controllers (not shown) communicatively coupling the respective storage device or system to the bus 316. The one or more data storage devices 360 may store, retain, or otherwise contain machine-readable instruction sets, data structures, program modules, data stores, databases, logical structures, and/or other data useful to the processor circuitry 120 and/or graphics processor circuitry 312 and/or one or more applications executed on or by the processor circuitry 120 and/or graphics processor circuitry 312. In some instances, one or more data storage devices 360 may be communicably coupled to the processor circuitry 120, for example via the bus 316 or via one or more wired communications interfaces 330 (e.g., Universal Serial Bus or USB); one or more wireless communications interfaces 320 (e.g., Bluetooth®, Near Field Communication or NFC); and/or one or more network interfaces 370 (IEEE 802.3 or Ethernet, IEEE 802.11, or WiFi®, etc.).

The processor-based device 300 may include power management circuitry 350 that controls one or more operational aspects of the energy storage device 352. In embodiments, the energy storage device 352 may include one or more primary (i.e., non-rechargeable) or secondary (i.e., rechargeable) batteries or similar energy storage devices. In embodiments, the energy storage device 352 may include one or more supercapacitors or ultracapacitors. In embodiments, the power management circuitry 350 may alter, adjust, or control the flow of energy from an external power source 354 to the energy storage device 352 and/or to the processor-based device 300. The power source 354 may include, but is not limited to, a solar power system, a commercial electric grid, a portable generator, an external energy storage device, or any combination thereof.

For convenience, the processor circuitry 120, the storage device 360, the system memory 170, the graphics processor circuitry 312, the wireless I/O interface 320, the wired I/O interface 330, the power management circuitry 350, and the network interface 370 are illustrated as communicatively coupled to each other via the bus 316, thereby providing connectivity between the above-described components. In alternative embodiments, the above-described components may be communicatively coupled in a different manner than illustrated in FIG. 3. For example, one or more of the above-described components may be directly coupled to other components, or may be coupled to each other, via one or more intermediary components (not shown). In another example, one or more of the above-described components may be integrated into the semiconductor package 110 and/or the graphics processor circuitry 312. In some embodiments, all or a portion of the bus 316 may be omitted and the components are coupled directly to each other using suitable wired or wireless connections.

Figure 4:
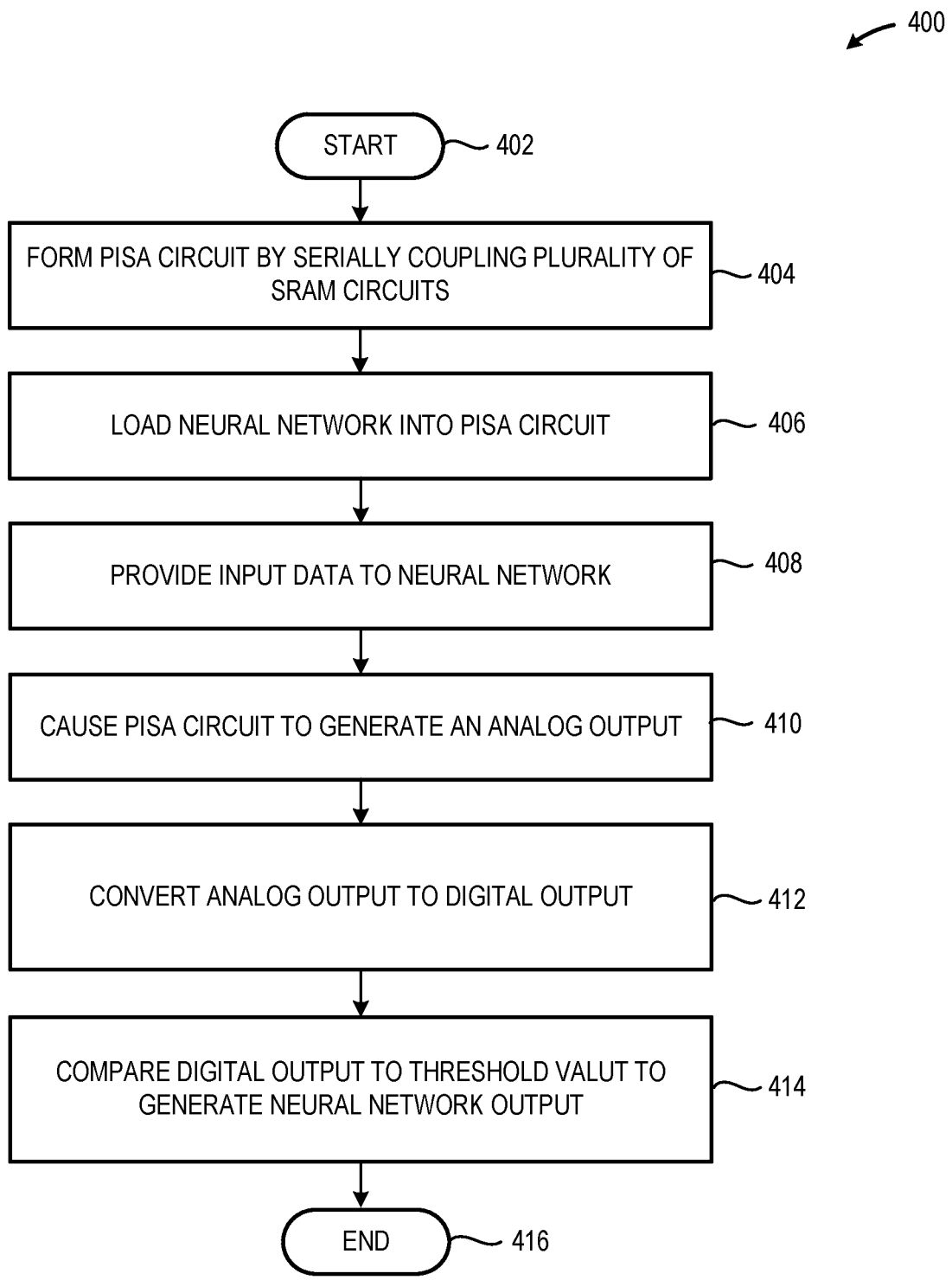
FIG. 4 is a high-level flow diagram of an illustrative method of performing one or more analog operations associated with a neural network using pipelined SRAM architecture (PISA) circuitry implemented in on-chip processor memory circuitry, in accordance with at least one embodiment described herein.

FIG. 4 is a high-level flow diagram of an illustrative method 400 of implementing an analog neural network 150 using pipelined SRAM architecture (PISA) circuitry 140 implemented in on-chip processor memory circuitry 130, in accordance with at least one embodiment described herein. The method 400 beneficially performs analog calculations using the serially coupled (i.e., pipelined) SRAM arrays included in the PISA circuitry 140 used to implement the neural network 150. The analog implementation of the neural network 150 in on-chip processor memory circuitry 130 such as LLC SRAM memory beneficially increases the computational density within the LLC without increasing physical space and/or power requirements. In embodiments, the analog value associated with an SRAM memory cell may be based on the voltage supplied by the cell when the cell is read. For example, the voltage retained by an SRAM memory cell may be adjusted based on the time a charge is allowed to build in the cell (i.e., by adjusting and/or controlling the write time of the cell). Thus, in addition to the actual data (the digital "1" or "0") retained in the memory cell the voltage read from the memory cell may also provide additional, multiple bits, of information. Taking advantage of this capability, the use of such analog techniques proves beneficial in applications requiring computation intensive determinations, such as neural network processing. The method 400 commences at 402.

At 404, a number of SRAM arrays are allocated and serially coupled within the on-chip processor memory circuitry 130 to provide the PISA circuit 140. In embodiments, the processor circuitry 120 allocates all or a portion of the SRAM arrays included in the PISA circuit 140. The SRAM arrays forming the PISA circuit 140 are serially coupled such that the output from the "$n^{th}$" layer of the neural network 150 flows to the "$(n+1)^{s}$" layer of the neural network 150. In a recurrent neural network 150, the state data 222 ($h_t$) from each of the layers in the recurrent neural network may be temporarily stored and copied to the prior state data ($h_{t-1}$) $220_{t-1}$ for the next iteration of the recurrent neural network 150.

At 406, a model representative of the neural network 150 is loaded into the PISA circuit 140. For example, in the illustrative recurrent neural network depicted in FIG. 2, the tensors or arrays containing the weight data $W_{xh}$ and $W_{hh}$ are loaded into the SRAM arrays $210_t$ and $210_{t-1}$, respectively. The tensor or array containing the input data $X_t$ is loaded into SRAM array $220_t$ and a tensor or array containing initial state data $h_{t-1}$ is loaded into SRAM array $220_{t-1}$. As the recurrent neural network 150 executes, the state data 222 ($h_t$) from each of the layers in the recurrent neural network may be temporarily stored and copied to the prior state data ($h_{t-1}$) $220_{t-1}$ for the next iteration of the recurrent neural network 150.

At 408, the neural network 150 begins execution using the input data provided in SRAM array $220_t$. Each successive layer of the neural network receives input data from the preceding neural network layer.

At 410, the analog calculation control circuitry 190 causes the PISA circuit 140 representing each layer of the neural network 150 to generate the one or more analog outputs based on the mathematical operations (e.g., matrix or tensor multiplication performed by the respective layer of the neural network 150.

At 412, the analog calculation control circuitry 190 causes the conversion circuitry 192 to convert the analog output from the PISA circuit 140 to one or more multi-bit digital output values. In embodiments, the analog calculation control circuitry 190 may cause one or more analog-to-digital (A/D) converters 192 to convert the analog output generated by the neural network 150 to the one or more multi-bit digital outputs.

At 414, the analog calculation control circuitry 190 compares the one or more multi-bit digital outputs to one or more threshold values. In embodiments, the analog calculation control circuitry 190 may cause threshold comparator circuitry 260 to compare the one or more multi-bit digital outputs to one or more defined threshold values. The method 400 concludes at 416.

Figure 5:
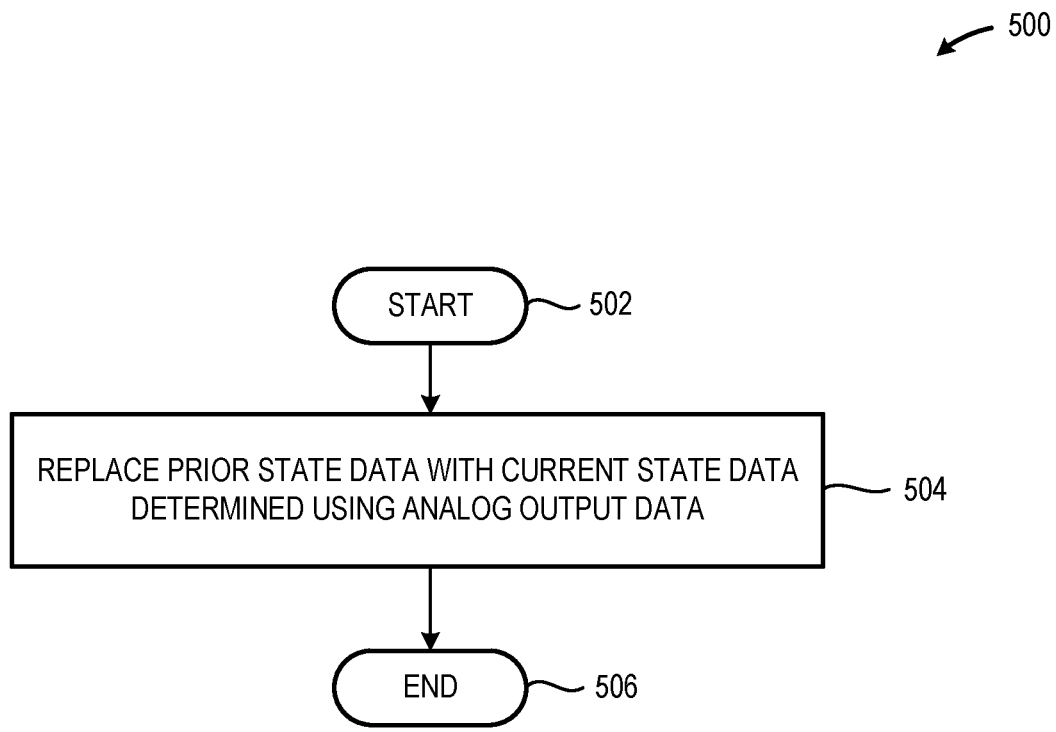
FIG. 5 is a high-level flow diagram of an illustrative method of replacing the prior state data ($h_{t-1}$) stored in a first SRAM array with current state data stored in a second SRAM array in preparation for the next iteration of a recurrent neural network, in accordance with at least one embodiment described herein.

FIG. 5 is a high-level flow diagram of an illustrative method 500 of replacing the prior state data ($h_{t-1}$) stored in SRAM array $220_{t-1}$ with current state data $h_t$ stored in SRAM array 222 in preparation for the next iteration of a recurrent neural network 150, in accordance with at least one embodiment described herein. The method 500 may be used in conjunction with the method 400 described in detail above with regard to FIG. 4. The method 500 commences at 502.

At 504, as the recurrent neural network 150 executes, the analog calculation control circuitry 190 causes a storage of the state data 222 ($h_t$) from each of the layers in the recurrent neural network 150. The analog calculation control circuitry 190 then causes a copy of the stored state data 222 to the SRAM array containing the prior state data ($h_{t-1}$) $220_{t-1}$ for the next iteration of the recurrent neural network 150. The method 500 concludes at 506.

While FIGS. 4 and 5 illustrate various operations according to one or more embodiments, it is to be understood that not all of the operations depicted in FIGS. 4 and 5 are necessary for other embodiments. Indeed, it is fully contemplated herein that in other embodiments of the present disclosure, the operations depicted in FIGS. 4 and 5, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

Embodiments of the instruction(s) detailed above are embodied may be embodied in a "generic vector friendly instruction format" which is detailed below. In other embodiments, such a format is not utilized and another instruction format is used, however, the description below of the writemask registers, various data transformations (swizzle, broadcast, etc.), addressing, etc. is generally applicable to the description of the embodiments of the instruction(s) above. Additionally, exemplary systems, architectures, and pipelines are detailed below. Embodiments of the instruction(s) above may be executed on such systems, architectures, and pipelines, but are not limited to those detailed.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2014; and see Intel® Advanced Vector Extensions Programming Reference, October 2014).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 6A:
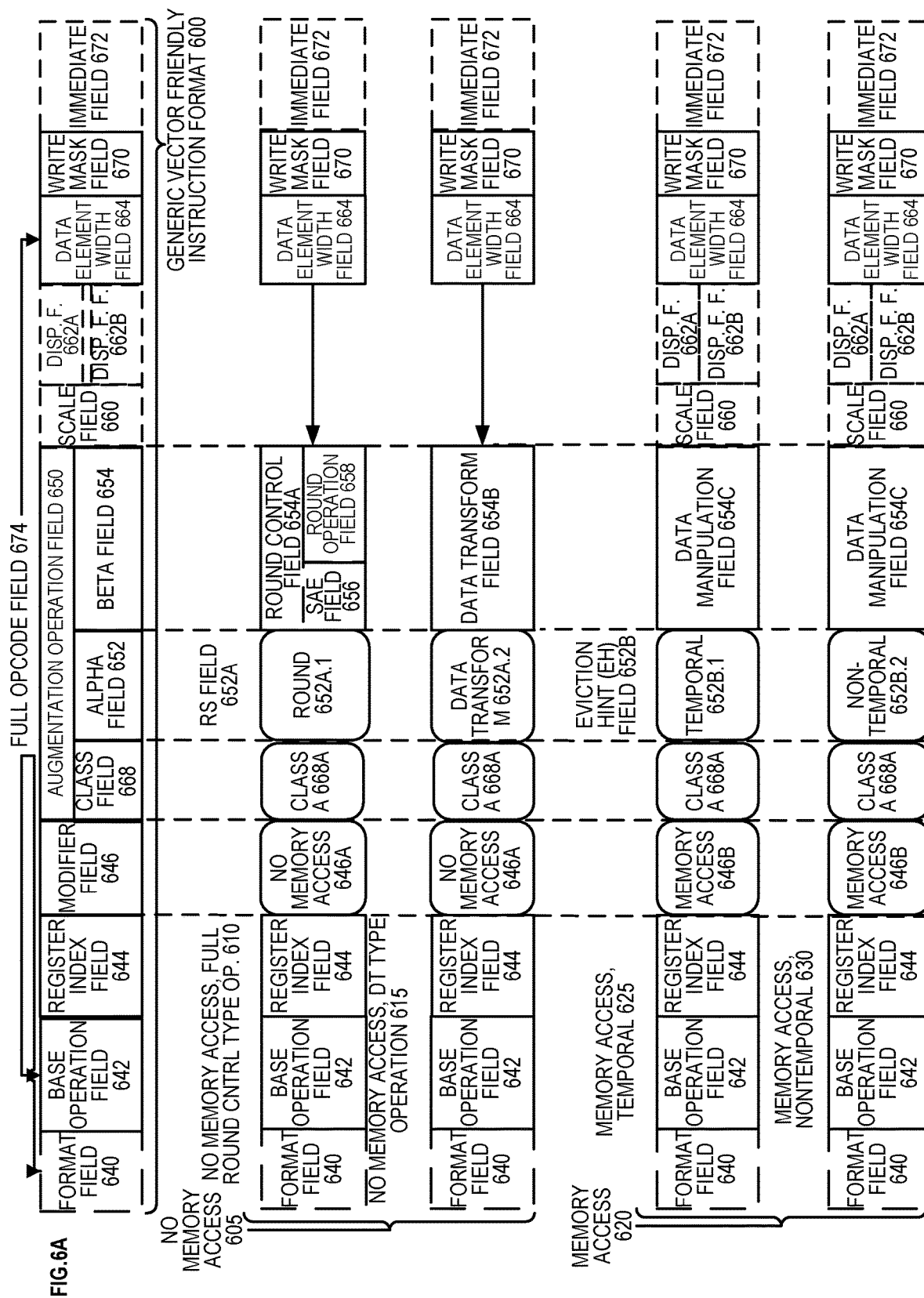
FIGS. 6A-6B are block diagrams illustrating a generic vector friendly instruction format and instruction templates thereof according to embodiments of the invention.
Figure 6B:
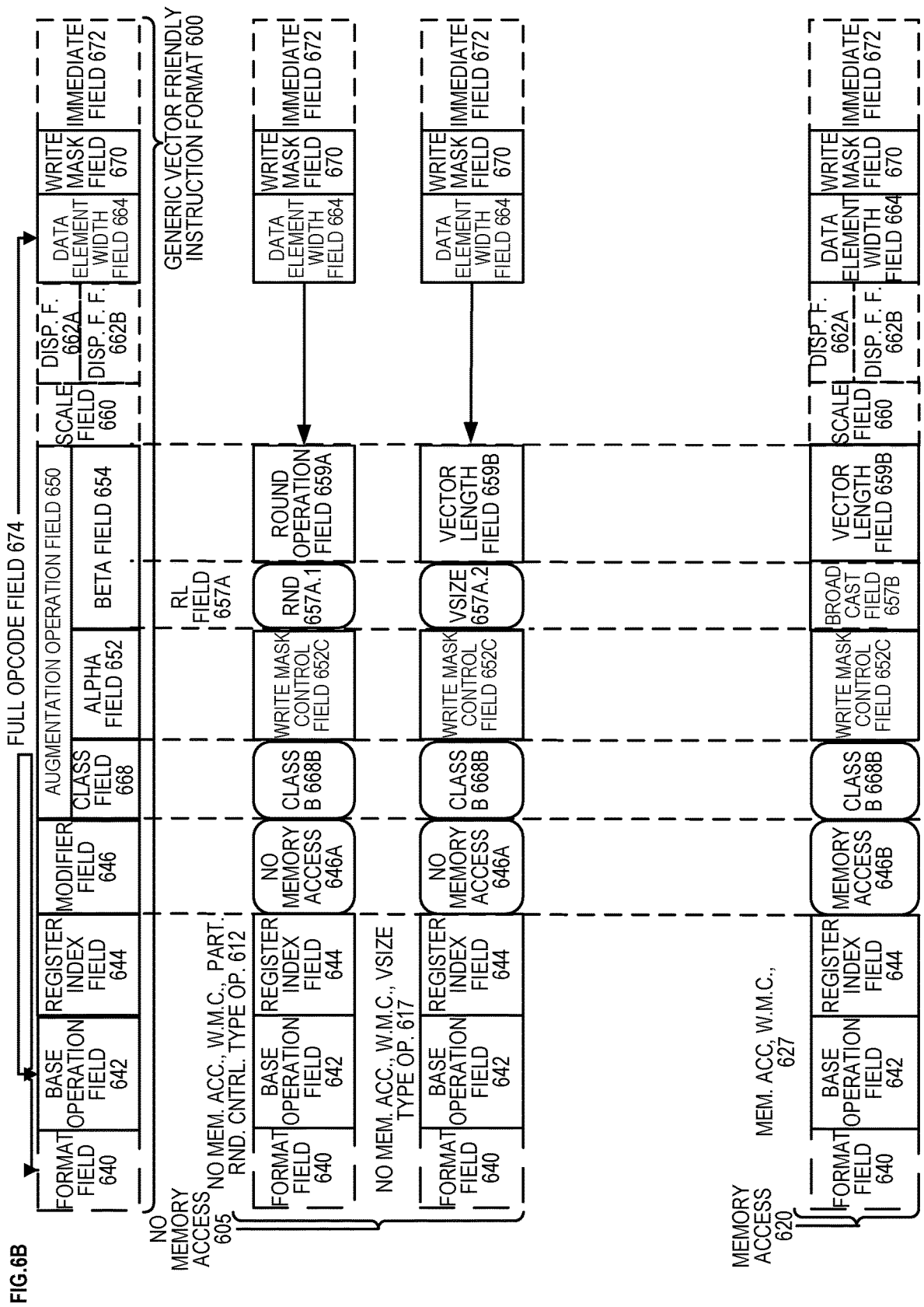

FIGS. 6A-6B are block diagrams illustrating a generic vector friendly instruction format and instruction templates thereof according to embodiments of the invention. FIG. 6A is a block diagram illustrating a generic vector friendly instruction format and class A instruction templates thereof according to embodiments of the invention; while FIG. 6B is a block diagram illustrating the generic vector friendly instruction format and class B instruction templates thereof according to embodiments of the invention. Specifically, a generic vector friendly instruction format 600 for which are defined class A and class B instruction templates, both of which include no memory access 605 instruction templates and memory access 620 instruction templates. The term generic in the context of the vector friendly instruction format refers to the instruction format not being tied to any specific instruction set.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 6A include: 1) within the no memory access 605 instruction templates there is shown a no memory access, full round control type operation 610 instruction template and a no memory access, data transform type operation 615 instruction template; and 2) within the memory access 620 instruction templates there is shown a memory access, temporal 625 instruction template and a memory access, non-temporal 630 instruction template. The class B instruction templates in FIG. 6B include: 1) within the no memory access 605 instruction templates there is shown a no memory access, write mask control, partial round control type operation 612 instruction template and a no memory access, write mask control, vsize type operation 617 instruction template; and 2) within the memory access 620 instruction templates there is shown a memory access, write mask control 627 instruction template.

The generic vector friendly instruction format 600 includes the following fields listed below in the order illustrated in FIGS. 6A-6B.

Format field 640—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 642—its content distinguishes different base operations.

Register index field 644—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 646—its content distinguishes occurrences of instructions in the generic vector instruction format that specify memory access from those that do not; that is, between no memory access 605 instruction templates and memory access 620 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 650—its content distinguishes which one of a variety of different operations to be performed in addition to the base operation. This field is context specific. In one embodiment of the invention, this field is divided into a class field 668, an alpha field 652, and a beta field 654. The augmentation operation field 650 allows common groups of operations to be performed in a single instruction rather than 2, 3, or 4 instructions.

Scale field 660—its content allows for the scaling of the index field's content for memory address generation (e.g., for address generation that uses $2^{scale}*index+base$).

Displacement Field 662A—its content is used as part of memory address generation (e.g., for address generation that uses $2^{scale}*index+base+displacement$).

Displacement Factor Field 662B (note that the juxtaposition of displacement field 662A directly over displacement factor field 662B indicates one or the other is used)—its content is used as part of address generation; it specifies a displacement factor that is to be scaled by the size of a memory access (N)—where N is the number of bytes in the memory access (e.g., for address generation that uses $2^{scale}*index+base+scaled\ displacement$). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 674 (described later herein) and the data manipulation field 654C. The displacement field 662A and the displacement factor field 662B are optional in the sense that they are not used for the no memory access 605 instruction templates and/or different embodiments may implement only one or none of the two.

Data element width field 664—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 670—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 670 allows for partial vector operations, including loads, stores, arithmetic, logical, etc. While embodiments of the invention are described in which the write mask field's 670 content selects one of a number of write mask registers that contains the write mask to be used (and thus the write mask field's 670 content indirectly identifies that masking to be performed), alternative embodiments instead or additional allow the mask write field's 670 content to directly specify the masking to be performed.

Immediate field 672—its content allows for the specification of an immediate. This field is optional in the sense that is it not present in an implementation of the generic vector friendly format that does not support immediate and it is not present in instructions that do not use an immediate.

Class field 668—its content distinguishes between different classes of instructions. With reference to FIGS. 6A-B, the contents of this field select between class A and class B instructions. In FIGS. 6A-B, rounded corner squares are used to indicate a specific value is present in a field (e.g., class A 668A and class B 668B for the class field 668 respectively in FIGS. 6A-B).

Instruction Templates of Class A

In the case of the non-memory access 605 instruction templates of class A, the alpha field 652 is interpreted as an RS field 652A, whose content distinguishes which one of the different augmentation operation types are to be performed (e.g., round 652A.1 and data transform 652A.2 are respectively specified for the no memory access, round type operation 610 and the no memory access, data transform type operation 615 instruction templates), while the beta field 654 distinguishes which of the operations of the specified type is to be performed. In the no memory access 605 instruction templates, the scale field 660, the displacement field 662A, and the displacement scale filed 662B are not present.

No-Memory Access Instruction Templates—Full Round Control Type Operation

In the no memory access full round control type operation 610 instruction template, the beta field 654 is interpreted as a round control field 654A, whose content(s) provide static rounding. While in the described embodiments of the invention the round control field 654A includes a suppress all floating point exceptions (SAE) field 656 and a round operation control field 658, alternative embodiments may support may encode both these concepts into the same field or only have one or the other of these concepts/fields (e.g., may have only the round operation control field 658).

SAE field 656—its content distinguishes whether or not to disable the exception event reporting; when the SAE field's 656 content indicates suppression is enabled, a given instruction does not report any kind of floating-point exception flag and does not raise any floating point exception handler.

Round operation control field 658—its content distinguishes which one of a group of rounding operations to perform (e.g., Round-up, Round-down, Round-towards-zero and Round-to-nearest). Thus, the round operation control field 658 allows for the changing of the rounding mode on a per instruction basis. In one embodiment of the invention where a processor includes a control register for specifying rounding modes, the round operation control field's 650 content overrides that register value.

No Memory Access Instruction Templates—Data Transform Type Operation

In the no memory access data transform type operation 615 instruction template, the beta field 654 is interpreted as a data transform field 654B, whose content distinguishes which one of a number of data transforms is to be performed (e.g., no data transform, swizzle, broadcast).

In the case of a memory access 620 instruction template of class A, the alpha field 652 is interpreted as an eviction hint field 652B, whose content distinguishes which one of the eviction hints is to be used (in FIG. 6A, temporal 652B.1 and non-temporal 652B.2 are respectively specified for the memory access, temporal 625 instruction template and the memory access, non-temporal 630 instruction template), while the beta field 654 is interpreted as a data manipulation field 654C, whose content distinguishes which one of a number of data manipulation operations (also known as primitives) is to be performed (e.g., no manipulation; broadcast; up conversion of a source; and down conversion of a destination). The memory access 620 instruction templates include the scale field 660, and optionally the displacement field 662A or the displacement scale field 662B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 652 is interpreted as a write mask control (Z) field 652C, whose content distinguishes whether the write masking controlled by the write mask field 670 should be a merging or a zeroing.

In the case of the non-memory access 605 instruction templates of class B, part of the beta field 654 is interpreted as an RL field 657A, whose content distinguishes which one of the different augmentation operation types are to be performed (e.g., round 657A.1 and vector length (VSIZE) 657A.2 are respectively specified for the no memory access, write mask control, partial round control type operation 612 instruction template and the no memory access, write mask control, VSIZE type operation 617 instruction template), while the rest of the beta field 654 distinguishes which of the operations of the specified type is to be performed. In the no memory access 605 instruction templates, the scale field 660, the displacement field 662A, and the displacement scale filed 662B are not present.

In the no memory access, write mask control, partial round control type operation 610 instruction template, the rest of the beta field 654 is interpreted as a round operation field 659A and exception event reporting is disabled (a given instruction does not report any kind of floating-point exception flag and does not raise any floating point exception handler).

Round operation control field 659A—just as round operation control field 658, its content distinguishes which one of a group of rounding operations to perform (e.g., Round-up, Round-down, Round-towards-zero and Round-to-nearest). Thus, the round operation control field 659A allows for the changing of the rounding mode on a per instruction basis. In one embodiment of the invention where a processor includes a control register for specifying rounding modes, the round operation control field's 650 content overrides that register value.

In the no memory access, write mask control, VSIZE type operation 617 instruction template, the rest of the beta field 654 is interpreted as a vector length field 659B, whose content distinguishes which one of a number of data vector lengths is to be performed on (e.g., 128, 256, or 512 byte).

In the case of a memory access 620 instruction template of class B, part of the beta field 654 is interpreted as a broadcast field 657B, whose content distinguishes whether or not the broadcast type data manipulation operation is to be performed, while the rest of the beta field 654 is interpreted the vector length field 659B. The memory access 620 instruction templates include the scale field 660, and optionally the displacement field 662A or the displacement scale field 662B.

With regard to the generic vector friendly instruction format 600, a full opcode field 674 is shown including the format field 640, the base operation field 642, and the data element width field 664. While one embodiment is shown where the full opcode field 674 includes all of these fields, the full opcode field 674 includes less than all of these fields in embodiments that do not support all of them. The full opcode field 674 provides the operation code (opcode).

The augmentation operation field 650, the data element width field 664, and the write mask field 670 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIG. 7 is a block diagram illustrating an exemplary specific vector friendly instruction format according to embodiments of the invention. FIG. 7 shows a specific vector friendly instruction format 700 that is specific in the sense that it specifies the location, size, interpretation, and order of the fields, as well as values for some of those fields. The specific vector friendly instruction format 700 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 6 into which the fields from FIG. 7 map are illustrated.

It should be understood that, although embodiments of the invention are described with reference to the specific vector friendly instruction format 700 in the context of the generic vector friendly instruction format 600 for illustrative purposes, the invention is not limited to the specific vector friendly instruction format 700 except where claimed. For example, the generic vector friendly instruction format 600 contemplates a variety of possible sizes for the various fields, while the specific vector friendly instruction format 700 is shown as having fields of specific sizes. By way of specific example, while the data element width field 664 is illustrated as a one bit field in the specific vector friendly instruction format 700, the invention is not so limited (that is, the generic vector friendly instruction format 600 contemplates other sizes of the data element width field 664).

The generic vector friendly instruction format 600 includes the following fields listed below in the order illustrated in FIG. 7A.

EVEX Prefix (Bytes 0-3) 702—is encoded in a four-byte form.

Format Field 640 (EVEX Byte 0, bits [7:0])—the first byte (EVEX Byte 0) is the format field 640 and it contains 0x62 the unique value used for distinguishing the vector friendly instruction format in one embodiment of the invention).

The second-fourth bytes (EVEX Bytes 1-3) include a number of bit fields providing specific capability.

REX field 705 (EVEX Byte 1, bits [7-5])—consists of a EVEX.R bit field (EVEX Byte 1, bit [7]-R), EVEX.X bit field (EVEX byte 1, bit [6]-X), and 657 BEX byte 1, bit[5]-B). The EVEX.R, EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 610—this is the first part of the REX' field 610 and is the EVEX.R' bit field (EVEX Byte 1, bit [4]-R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 715 (EVEX byte 1, bits [3:0]-mmmm)—its content encodes an implied leading opcode byte (0F, 0F 38, or 0F 3).

Data element width field 664 (EVEX byte 2, bit [7]-W)—is represented by the notation EVEX.W. EVEX.W is used to define the granularity (size) of the datatype (either 32-bit data elements or 64-bit data elements).

EVEX.vvvv 720 (EVEX Byte 2, bits [6:3]-vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 720 encodes the 4 low-order bits of the first source register specifier stored in inverted (1s complement) form. Depending on the instruction, an extra different EVEX bit field is used to extend the specifier size to 32 registers.

EVEX.U 668 Class field (EVEX byte 2, bit [2]-U)—If EVEX.U=0, it indicates class A or EVEX.U0; if EVEX.U=1, it indicates class B or EVEX.U1.

Prefix encoding field 725 (EVEX byte 2, bits [1:0]-pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 652 (EVEX byte 3, bit [7]-EH; also known as EVEX.EH, EVEX.rs, EVEX.RL, EVEX.write mask control, and EVEX.N; also illustrated with α)—as previously described, this field is context specific.

Beta field 654 (EVEX byte 3, bits [6:4]-SSS, also known as EVEX.s$_{2-0}$, EVEX.r$_{2-0}$, EVEX.rr1, EVEX.LL0, EVEX.LLB; also illustrated with βββ)—as previously described, this field is context specific.

REX' field 610—this is the remainder of the REX' field and is the EVEX.V' bit field (EVEX Byte 3, bit [3]-V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 670 (EVEX byte 3, bits [2:0]-kkk)—its content specifies the index of a register in the write mask registers as previously described. In one embodiment of the invention, the specific value EVEX kkk=000 has a special behavior implying no write mask is used for the particular instruction (this may be implemented in a variety of ways including the use of a write mask hardwired to all ones or hardware that bypasses the masking hardware).

Real Opcode Field 730 (Byte 4) is also known as the opcode byte. Part of the opcode is specified in this field.

MOD R/M Field 740 (Byte 5) includes MOD field 742, Reg field 744, and R/M field 746. As previously described, the MOD field's 742 content distinguishes between memory access and non-memory access operations. The role of Reg field 744 can be summarized to two situations: encoding either the destination register operand or a source register operand, or be treated as an opcode extension and not used to encode any instruction operand. The role of R/M field 746 may include the following: encoding the instruction operand that references a memory address, or encoding either the destination register operand or a source register operand.

Scale, Index, Base (SIB) Byte (Byte 6)—As previously described, the scale field's 650 content is used for memory address generation. SIB.xxx 754 and SIB.bbb 756—the contents of these fields have been previously referred to with regard to the register indexes Xxxx and Bbbb.

Displacement field 662A (Bytes 7-10)—when MOD field 742 contains 10, bytes 7-10 are the displacement field 662A, and it works the same as the legacy 32-bit displacement (disp32) and works at byte granularity.

Displacement factor field 662B (Byte 7)—when MOD field 742 contains 01, byte 7 is the displacement factor field 662B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 662B is a reinterpretation of disp8; when using displacement factor field 662B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 662B substitutes the legacy x86 instruction set 8-bit displacement. Thus, the displacement factor field 662B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset). Immediate field 672 operates as previously described.

Full Opcode Field

FIG. 7B is a block diagram illustrating the fields of the specific vector friendly instruction format 700 that make up the full opcode field 674 according to one embodiment of the invention. Specifically, the full opcode field 674 includes the format field 640, the base operation field 642, and the data element width (W) field 664. The base operation field 642 includes the prefix encoding field 725, the opcode map field 715, and the real opcode field 730.

Register Index Field

FIG. 7C is a block diagram illustrating the fields of the specific vector friendly instruction format 700 that make up the register index field 644 according to one embodiment of the invention. Specifically, the register index field 644 includes the REX field 705, the REX' field 710, the MODR/M.reg field 744, the MODR/M.r/m field 746, the VVVV field 720, xxx field 754, and the bbb field 756.

Augmentation Operation Field

Figure 7D:
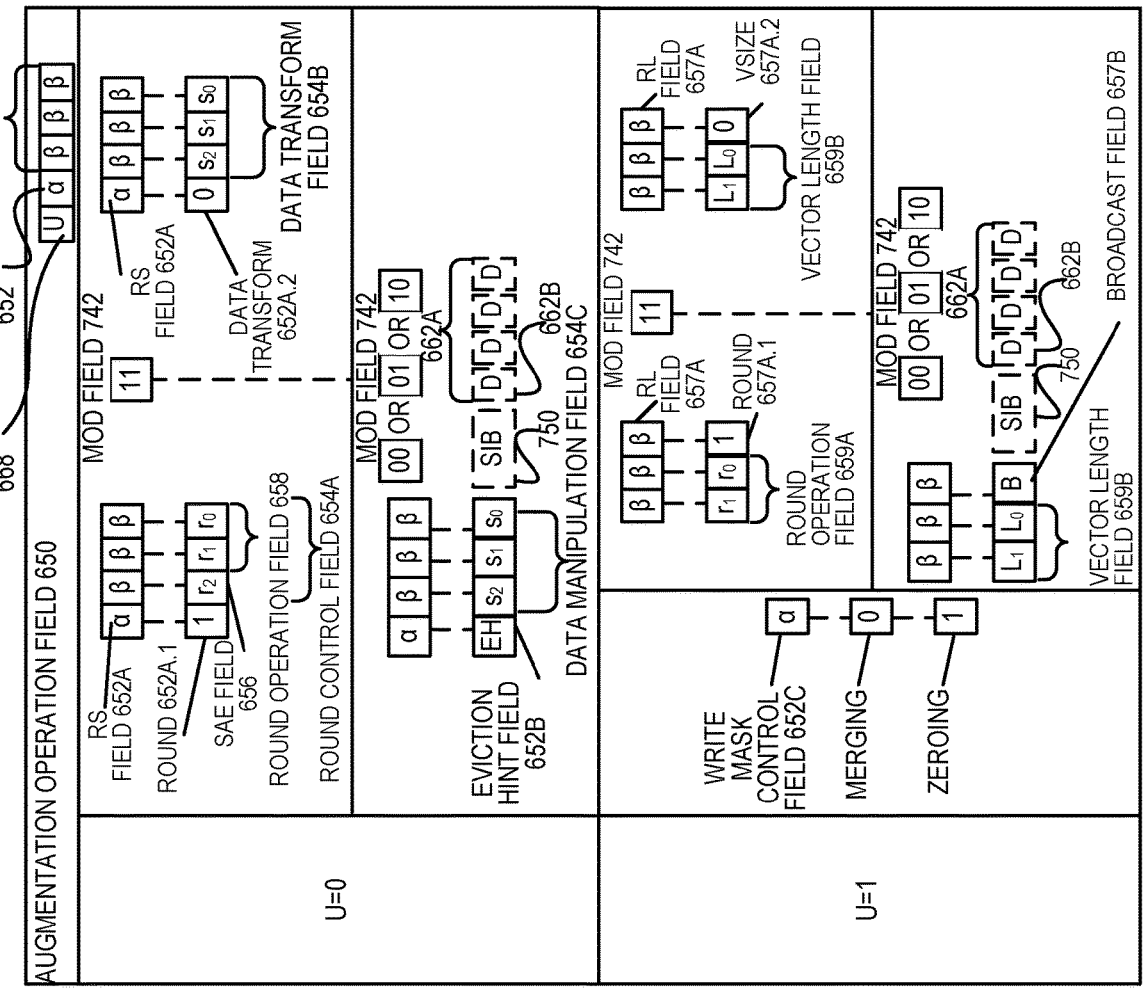

FIG. 7D is a block diagram illustrating the fields of the specific vector friendly instruction format 700 that make up the augmentation operation field 650 according to one embodiment of the invention. When the class (U) field 668 contains 0, it signifies EVEX.U0 (class A 668A); when it contains 1, it signifies EVEX.U1 (class B 668B). When U=0 and the MOD field 742 contains 11 (signifying a no memory access operation), the alpha field 652 (EVEX byte 3, bit [7]-EH) is interpreted as the rs field 652A. When the rs field 652A contains a 1 (round 652A.1), the beta field 654 (EVEX byte 3, bits [6:4]-SSS) is interpreted as the round control field 654A. The round control field 654A includes a one bit SAE field 656 and a two bit round operation field 658. When the rs field 652A contains a 0 (data transform 652A.2), the beta field 654 (EVEX byte 3, bits [6:4]-SSS) is interpreted as a three bit data transform field 654B. When U=0 and the MOD field 742 contains 00, 01, or 10 (signifying a memory access operation), the alpha field 652 (EVEX byte 3, bit [7]-EH) is interpreted as the eviction hint (EH) field 652B and the beta field 654 (EVEX byte 3, bits [6:4]-SSS) is interpreted as a three bit data manipulation field 654C.

When U=1, the alpha field 652 (EVEX byte 3, bit [7]-EH) is interpreted as the write mask control (Z) field 652C. When U=1 and the MOD field 742 contains 11 (signifying a no memory access operation), part of the beta field 654 (EVEX byte 3, bit [4]-$S_0$) is interpreted as the RL field 657A; when it contains a 1 (round 657A.1) the rest of the beta field 654 (EVEX byte 3, bit [6-5]-$S_{2-1}$) is interpreted as the round operation field 659A, while when the RL field 657A contains a 0 (VSIZE 657.A2) the rest of the beta field 654 (EVEX byte 3, bit [6-5]-$S_{2-1}$) is interpreted as the vector length field 659B (EVEX byte 3, bit [6-5]-$L_{1-0}$). When U=1 and the MOD field 742 contains 00, 01, or 10 (signifying a memory access operation), the beta field 654 (EVEX byte 3, bits [6:4]-SSS) is interpreted as the vector length field 659B (EVEX byte 3, bit [6-5]-$L_{1-0}$) and the broadcast field 657B (EVEX byte 3, bit [4]-B).

Exemplary Register Architecture

Figure 8:
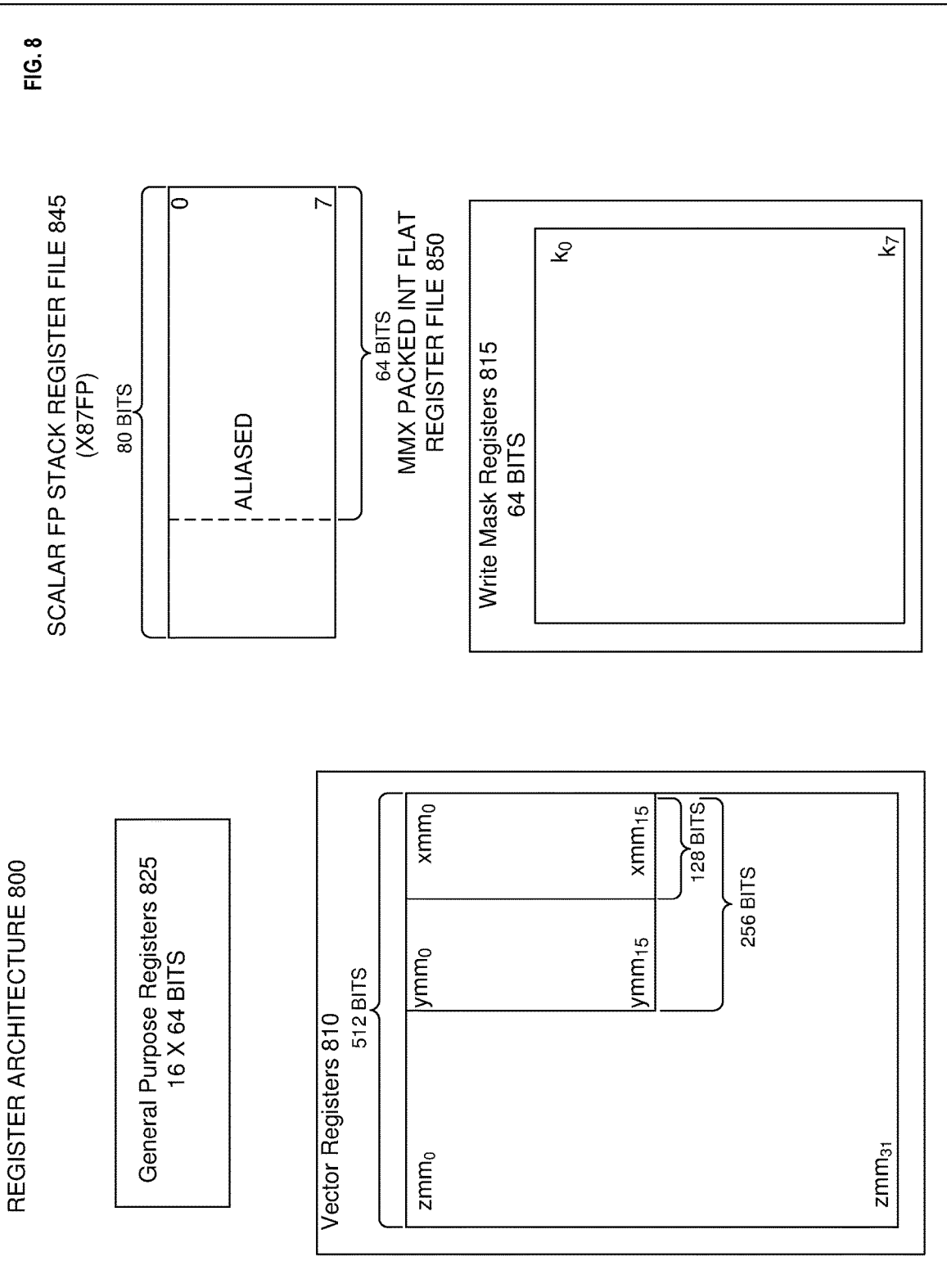
FIG. 8 is a block diagram of a register architecture according to one embodiment of the invention.

FIG. 8 is a block diagram of a register architecture 800 according to one embodiment of the invention. In the embodiment illustrated, there are 32 vector registers 810 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 700 operates on these overlaid register file as illustrated in the below tables.

| Adjustable Vector Length | Class | Operations | Registers |
|---|---|---|---|
| Instruction Templates that do not include | A (FIG. 6A; U = 0) | 610, 615, 625, 630 | zmm registers (the vector length is 64 byte) |
| the vector length field 659B | B (FIG. 6B; U = 1) | 612 | zmm registers (the vector length is 64 byte) |
| Instruction templates that do include the vector length field 659B | B (FIG. 6B; U = 1) | 617, 627 | zmm, ymm, or xmm registers (the vector length is 64 byte, 32 byte, or 16 byte) depending on the vector length field 659B |

In other words, the vector length field 659B selects between a maximum length and one or more other shorter lengths, where each such shorter length is half the length of the preceding length; and instructions templates without the vector length field 659B operate on the maximum vector length. Further, in one embodiment, the class B instruction templates of the specific vector friendly instruction format 700 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 815—in the embodiment illustrated, there are 8 write mask registers (k0 through k7), each 64 bits in size. In an alternate embodiment, the write mask registers 815 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 825—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 845, on which is aliased the MMX packed integer flat register file 850—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

FIG. 9A is a block diagram illustrating both an exemplary in-order pipeline and an exemplary register renaming, out-of-order issue/execution pipeline according to embodiments of the invention. FIG. 9B is a block diagram illustrating both an exemplary embodiment of an in-order architecture core and an exemplary register renaming, out-of-order issue/execution architecture core to be included in a processor according to embodiments of the invention. The solid lined boxes in FIGS. 9A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 9A, a processor pipeline 900 includes a fetch stage 902, a length decode stage 904, a decode stage 906, an allocation stage 908, a renaming stage 910, a scheduling (also known as a dispatch or issue) stage 912, a register read/memory read stage 914, an execute stage 916, a write back/memory write stage 918, an exception handling stage 922, and a commit stage 924.

FIG. 9B shows processor core 990 including a front end unit 930 coupled to an execution engine unit 950, and both are coupled to a memory unit 970. The core 990 may be a reduced instruction set computing (RISC) core, a complex instruction set computing (CISC) core, a very long instruction word (VLIW) core, or a hybrid or alternative core type. As yet another option, the core 990 may be a special-purpose core, such as, for example, a network or communication core, compression engine, coprocessor core, general purpose computing graphics processing unit (GPGPU) core, graphics core, or the like.

The front end unit 930 includes a branch prediction unit 932 coupled to an instruction cache unit 934, which is coupled to an instruction translation lookaside buffer (TLB) 936, which is coupled to an instruction fetch unit 938, which is coupled to a decode unit 940. The decode unit 940 (or decoder) may decode instructions, and generate as an output one or more micro-operations, micro-code entry points, microinstructions, other instructions, or other control signals, which are decoded from, or which otherwise reflect, or are derived from, the original instructions. The decode unit 940 may be implemented using various different mechanisms. Examples of suitable mechanisms include, but are not limited to, look-up tables, hardware implementations, programmable logic arrays (PLAs), microcode read only memories (ROMs), etc. In one embodiment, the core 990 includes a microcode ROM or other medium that stores microcode for certain macroinstructions (e.g., in decode unit 940 or otherwise within the front end unit 930). The decode unit 940 is coupled to a rename/allocator unit 952 in the execution engine unit 950.

The execution engine unit 950 includes the rename/allocator unit 952 coupled to a retirement unit 954 and a set of one or more scheduler unit(s) 956. The scheduler unit(s) 956 represents any number of different schedulers, including reservations stations, central instruction window, etc. The scheduler unit(s) 956 is coupled to the physical register file(s) unit(s) 958. Each of the physical register file(s) units 958 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 958 comprises a vector registers unit, a write mask registers unit, and a scalar registers unit. These register units may provide architectural vector registers, vector mask registers, and general purpose registers. The physical register file(s) unit(s) 958 is overlapped by the retirement unit 954 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 954 and the physical register file(s) unit(s) 958 are coupled to the execution cluster(s) 960. The execution cluster(s) 960 includes a set of one or more execution units 962 and a set of one or more memory access units 964. The execution units 962 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 956, physical register file(s) unit(s) 958, and execution cluster(s) 960 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 964). It should also be understood that where separate pipelines are used, one or more of these pipelines may be out-of-order issue/execution and the rest in-order.

The set of memory access units 964 is coupled to the memory unit 970, which includes a data TLB unit 972 coupled to a data cache unit 974 coupled to a level 2 (L2) cache unit 976. In one exemplary embodiment, the memory access units 964 may include a load unit, a store address unit, and a store data unit, each of which is coupled to the data TLB unit 972 in the memory unit 970. The instruction cache unit 934 is further coupled to a level 2 (L2) cache unit 976 in the memory unit 970. The L2 cache unit 976 is coupled to one or more other levels of cache and eventually to a main memory.

By way of example, the exemplary register renaming, out-of-order issue/execution core architecture may implement the pipeline 900 as follows: 1) the instruction fetch 938 performs the fetch and length decoding stages 902 and 904; 2) the decode unit 940 performs the decode stage 906; 3) the rename/allocator unit 952 performs the allocation stage 908 and renaming stage 910; 4) the scheduler unit(s) 956 performs the schedule stage 912; 5) the physical register file(s) unit(s) 958 and the memory unit 970 perform the register read/memory read stage 914; the execution cluster 960 perform the execute stage 916; 6) the memory unit 970 and the physical register file(s) unit(s) 958 perform the write back/memory write stage 918; 7) various units may be involved in the exception handling stage 922; and 8) the retirement unit 954 and the physical register file(s) unit(s) 958 perform the commit stage 924.

The core 990 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 990 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 934/974 and a shared L2 cache unit 976, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 10B:
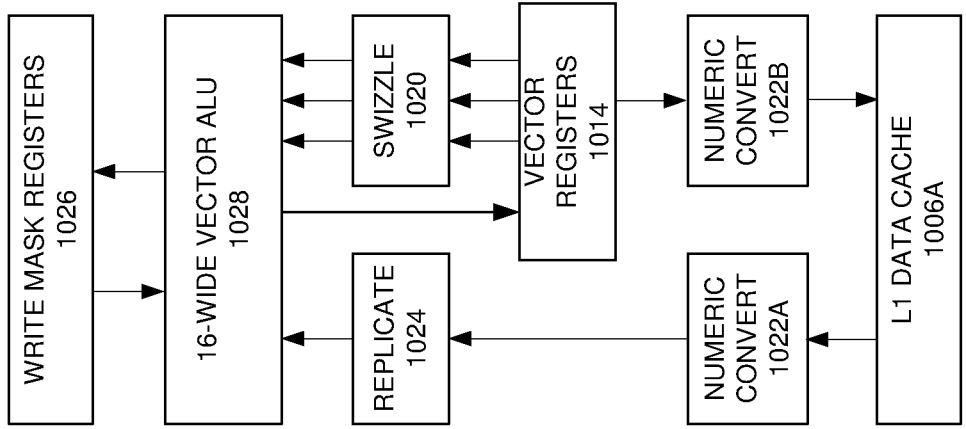
FIGS. 10A-B illustrate a block diagram of a more specific exemplary in-order core architecture, which core would be one of several logic blocks (including other cores of the same type and/or different types) in a chip.
Figure 10A:
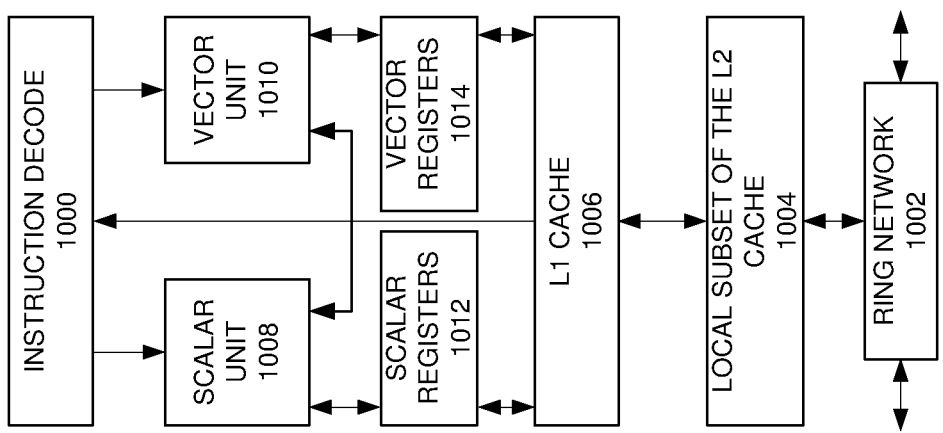

FIGS. 10A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 10A is a block diagram of a single processor core, along with its connection to the on-die interconnect network 1002 and with its local subset of the Level 2 (L2) cache 1004, according to embodiments of the invention. In one embodiment, an instruction decoder 1000 supports the x86 instruction set with a packed data instruction set extension. An L1 cache 1006 allows low-latency accesses to cache memory into the scalar and vector units. While in one embodiment (to simplify the design), a scalar unit 1008 and a vector unit 1010 use separate register sets (respectively, scalar registers 1012 and vector registers 1014) and data transferred between them is written to memory and then read back in from a level 1 (L1) cache 1006, alternative embodiments of the invention may use a different approach (e.g., use a single register set or include a communication path that allow data to be transferred between the two register files without being written and read back).

The local subset of the L2 cache 1004 is part of a global L2 cache that is divided into separate local subsets, one per processor core. Each processor core has a direct access path to its own local subset of the L2 cache 1004. Data read by a processor core is stored in its L2 cache subset 1004 and can be accessed quickly, in parallel with other processor cores accessing their own local L2 cache subsets. Data written by a processor core is stored in its own L2 cache subset 1004 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 10B is an expanded view of part of the processor core in FIG. 10A according to embodiments of the invention. FIG. 10B includes an L1 data cache 1006A part of the L1 cache 1004, as well as more detail regarding the vector unit 1010 and the vector registers 1014. Specifically, the vector unit 1010 is a 16-wide vector processing unit (VPU) (see the 16-wide ALU 1028), which executes one or more of integer, single-precision float, and double-precision float instructions. The VPU supports swizzling the register inputs with swizzle unit 1020, numeric conversion with numeric convert units 1022A-B, and replication with replication unit 1024 on the memory input. Write mask registers 1026 allow predicating resulting vector writes.

Figure 11:
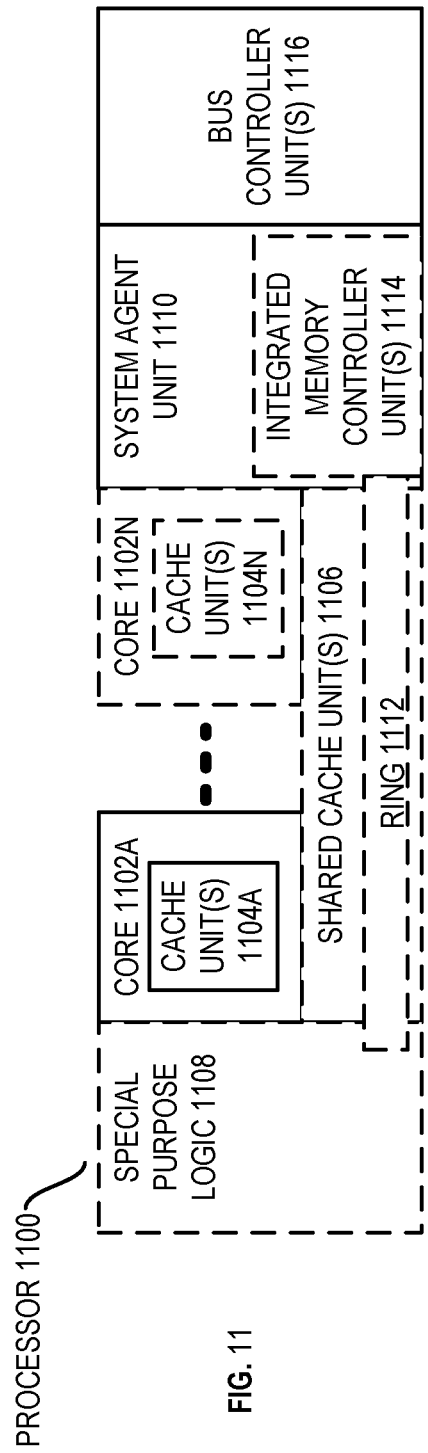
FIG. 11 is a block diagram of a processor that may have more than one core, may have an integrated memory controller, and may have integrated graphics according to embodiments of the invention.

FIG. 11 is a block diagram of a processor 1100 that may have more than one core, may have an integrated memory controller, and may have integrated graphics according to embodiments of the invention. The solid lined boxes in FIG. 11 illustrate a processor 1100 with a single core 1102A, a system agent 1110, a set of one or more bus controller units 1116, while the optional addition of the dashed lined boxes illustrates an alternative processor 1100 with multiple cores 1102A-N, a set of one or more integrated memory controller unit(s) 1114 in the system agent unit 1110, and special purpose logic 1108.

Thus, different implementations of the processor 1100 may include: 1) a CPU with the special purpose logic 1108 being integrated graphics and/or scientific (throughput) logic (which may include one or more cores), and the cores 1102A-N being one or more general purpose cores (e.g., general purpose in-order cores, general purpose out-of-order cores, a combination of the two); 2) a coprocessor with the cores 1102A-N being a large number of special purpose cores intended primarily for graphics and/or scientific (throughput); and 3) a coprocessor with the cores 1102A-N being a large number of general purpose in-order cores. Thus, the processor 1100 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1100 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1106, and external memory (not shown) coupled to the set of integrated memory controller units 1114. The set of shared cache units 1106 may include one or more mid-level caches, such as level 2 (L2), level 3 (L3), level 4 (L4), or other levels of cache, a last level cache (LLC), and/or combinations thereof. While in one embodiment a ring based interconnect unit 1112 interconnects the integrated graphics logic 1108, the set of shared cache units 1106, and the system agent unit 1110/integrated memory controller unit(s) 1114, alternative embodiments may use any number of well-known techniques for interconnecting such units. In one embodiment, coherency is maintained between one or more cache units 1106 and cores 1102-A-N.

In some embodiments, one or more of the cores 1102A-N are capable of multi-threading. The system agent 1110 includes those components coordinating and operating cores 1102A-N. The system agent unit 1110 may include for example a power control unit (PCU) and a display unit. The PCU may be or include logic and components needed for regulating the power state of the cores 1102A-N and the integrated graphics logic 1108. The display unit is for driving one or more externally connected displays.

The cores 1102A-N may be homogenous or heterogeneous in terms of architecture instruction set; that is, two or more of the cores 1102A-N may be capable of execution the same instruction set, while others may be capable of executing only a subset of that instruction set or a different instruction set.

Exemplary Computer Architectures

FIGS. 12-15 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 12:
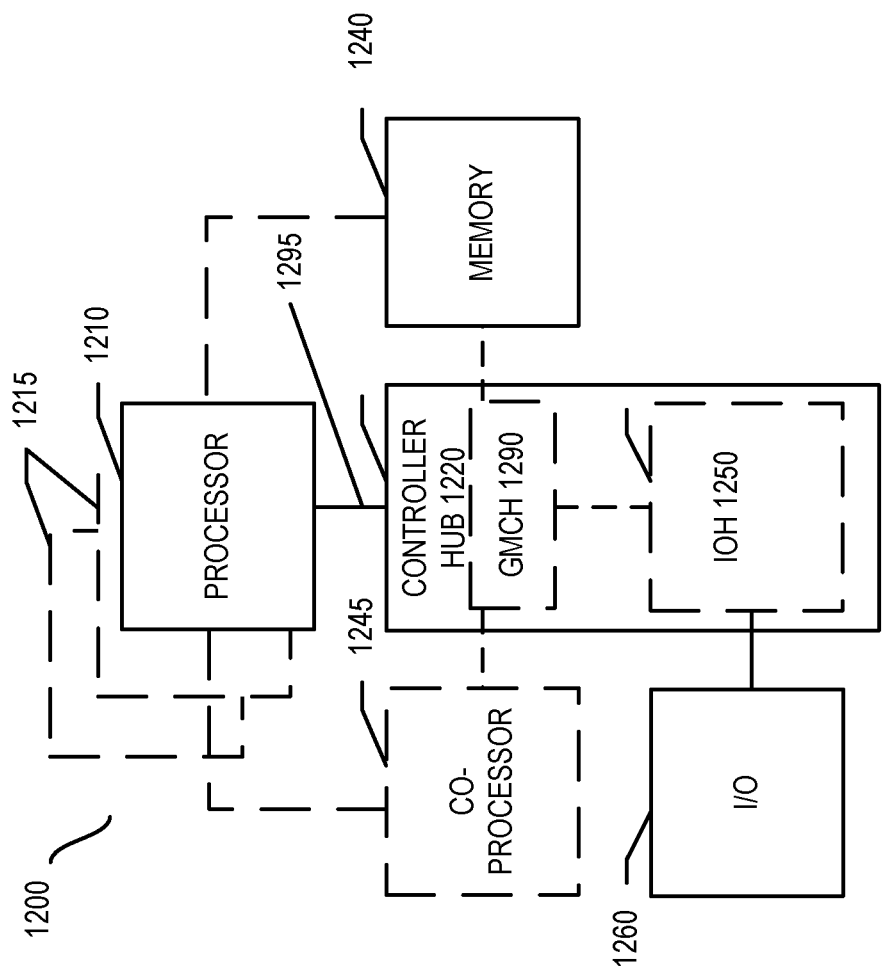
FIGS. 12, 13, 14, and 15 are block diagrams of exemplary computer architectures.

Referring now to FIG. 12, shown is a block diagram of a system 1200 in accordance with one embodiment of the present invention. The system 1200 may include one or more processors 1210, 1215, which are coupled to a controller hub 1220. In one embodiment the controller hub 1220 includes a graphics memory controller hub (GMCH) 1290 and an Input/Output Hub (IOH) 1250 (which may be on separate chips); the GMCH 1290 includes memory and graphics controllers to which are coupled memory 1240 and a coprocessor 1245; the IOH 1250 is couples input/output (I/O) devices 1260 to the GMCH 1290. Alternatively, one or both of the memory and graphics controllers are integrated within the processor (as described herein), the memory 1240 and the coprocessor 1245 are coupled directly to the processor 1210, and the controller hub 1220 in a single chip with the IOH 1250.

The optional nature of additional processors 1215 is denoted in FIG. 12 with broken lines. Each processor 1210, 1215 may include one or more of the processing cores described herein and may be some version of the processor 1100.

The memory 1240 may be, for example, dynamic random access memory (DRAM), phase change memory (PCM), or a combination of the two. For at least one embodiment, the controller hub 1220 communicates with the processor(s) 1210, 1215 via a multi-drop bus, such as a frontside bus (FSB), point-to-point interface such as QuickPath Interconnect (QPI), or similar connection 1295.

In one embodiment, the coprocessor 1245 is a special-purpose processor, such as, for example, a high-throughput MIC processor, a network or communication processor, compression engine, graphics processor, GPGPU, embedded processor, or the like. In one embodiment, controller hub 1220 may include an integrated graphics accelerator.

There can be a variety of differences between the physical resources 1210, 1215 in terms of a spectrum of metrics of merit including architectural, microarchitectural, thermal, power consumption characteristics, and the like.

In one embodiment, the processor 1210 executes instructions that control data processing operations of a general type. Embedded within the instructions may be coprocessor instructions. The processor 1210 recognizes these coprocessor instructions as being of a type that should be executed by the attached coprocessor 1245. Accordingly, the processor 1210 issues these coprocessor instructions (or control signals representing coprocessor instructions) on a coprocessor bus or other interconnect, to coprocessor 1245. Coprocessor(s) 1245 accept and execute the received coprocessor instructions.

Figure 13:
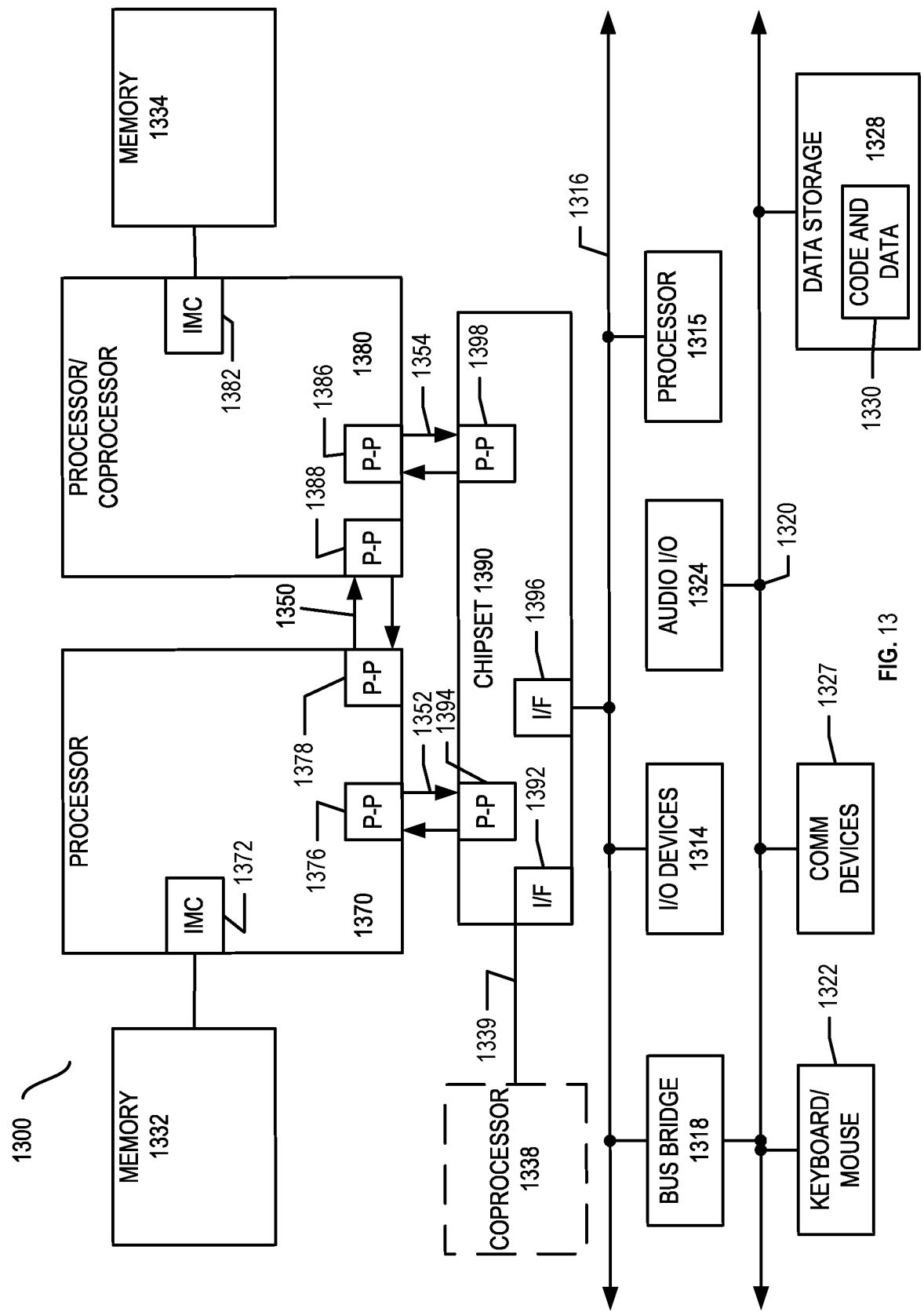

Referring now to FIG. 13, shown is a block diagram of a first more specific exemplary system 1300 in accordance with an embodiment of the present invention. As shown in FIG. 13, multiprocessor system 1300 is a point-to-point interconnect system, and includes a first processor 1370 and a second processor 1380 coupled via a point-to-point interconnect 1350. Each of processors 1370 and 1380 may be some version of the processor 1100. In one embodiment of the invention, processors 1370 and 1380 are respectively processors 1210 and 1215, while coprocessor 1338 is coprocessor 1245. In another embodiment, processors 1370 and 1380 are respectively processor 1210 coprocessor 1245.

Processors 1370 and 1380 are shown including integrated memory controller (IMC) units 1372 and 1382, respectively. Processor 1370 also includes as part of its bus controller units point-to-point (P-P) interfaces 1376 and 1378; similarly, second processor 1380 includes P-P interfaces 1386 and 1388. Processors 1370, 1380 may exchange information via a point-to-point (P-P) interface 1350 using P-P interface circuits 1378, 1388. As shown in FIG. 13, IMCs 1372 and 1382 couple the processors to respective memories, namely a memory 1332 and a memory 1334, which may be portions of main memory locally attached to the respective processors.

Processors 1370, 1380 may each exchange information with a chipset 1390 via individual P-P interfaces 1352, 1354 using point to point interface circuits 1376, 1394, 1386, 1398. Chipset 1390 may optionally exchange information with the coprocessor 1338 via a high-performance interface 1339. In one embodiment, the coprocessor 1338 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1390 may be coupled to a first bus 1316 via an interface 1396. In one embodiment, first bus 1316 may be a Peripheral Component Interconnect (PCI) bus, or a bus such as a PCI Express bus or another third generation I/O interconnect bus, although the scope of the present invention is not so limited.

As shown in FIG. 13, various I/O devices 1314 may be coupled to first bus 1316, along with a bus bridge 1318 which couples first bus 1316 to a second bus 1320. In one embodiment, one or more additional processor(s) 1315, such as coprocessors, high-throughput MIC processors, GPGPU's, accelerators (such as, e.g., graphics accelerators or digital signal processing (DSP) units), field programmable gate arrays, or any other processor, are coupled to first bus 1316. In one embodiment, second bus 1320 may be a low pin count (LPC) bus. Various devices may be coupled to a second bus 1320 including, for example, a keyboard and/or mouse 1322, communication devices 1327 and a storage unit 1328 such as a disk drive or other mass storage device which may include instructions/code and data 1330, in one embodiment. Further, an audio I/O 1324 may be coupled to the second bus 1320. Note that other architectures are possible. For example, instead of the point-to-point architecture of FIG. 13, a system may implement a multi-drop bus or other such architecture.

Figure 14:
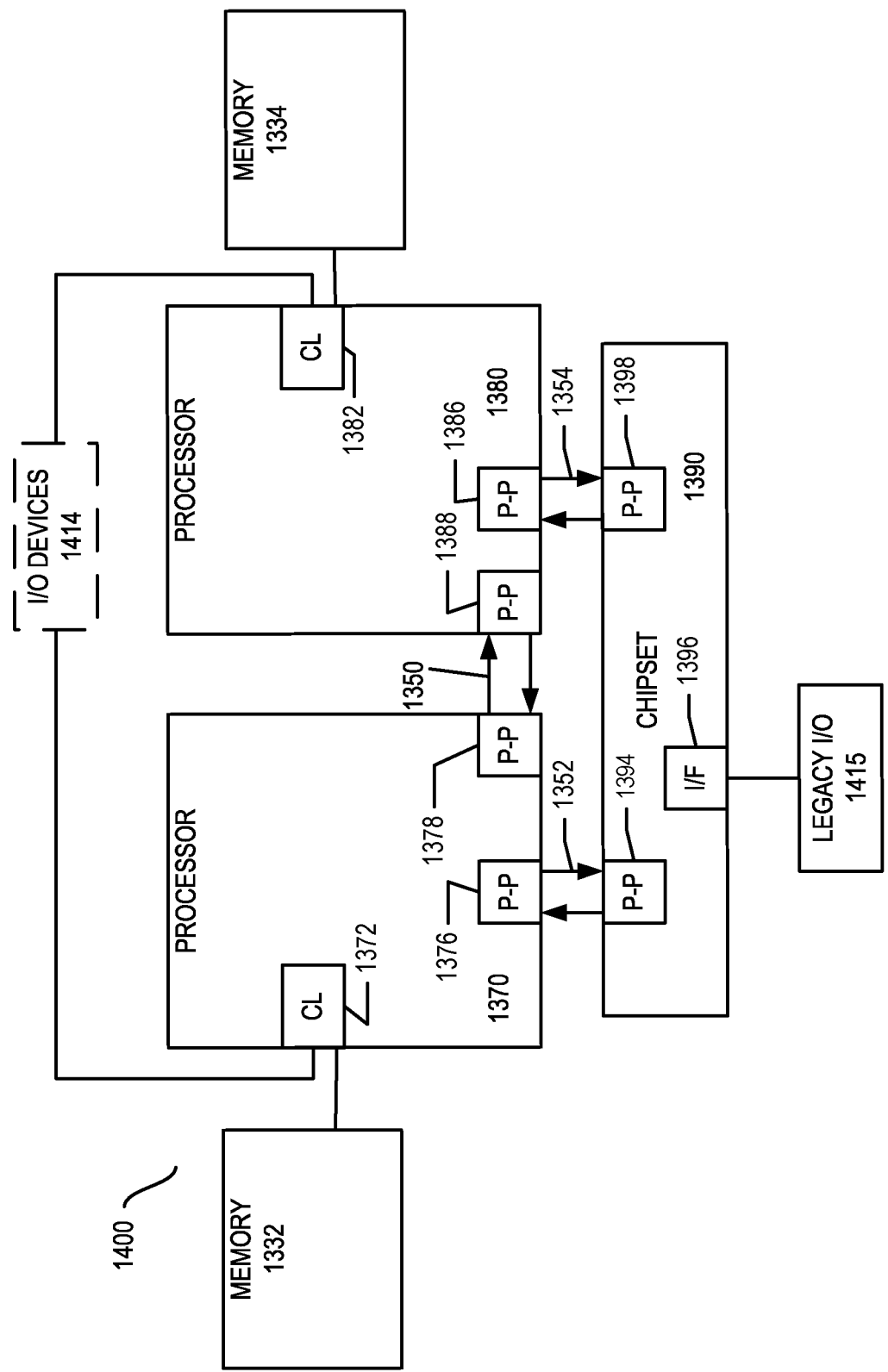

Referring now to FIG. 14, shown is a block diagram of a second more specific exemplary system 1400 in accordance with an embodiment of the present invention. Like elements in FIGS. 13 and 14 bear like reference numerals, and certain aspects of FIG. 13 have been omitted from FIG. 14 in order to avoid obscuring other aspects of FIG. 14.

FIG. 14 illustrates that the processors 1370, 1380 may include integrated memory and I/O control logic ("CL") 1372 and 1382, respectively. Thus, the CL 1372, 1382 include integrated memory controller units and include I/O control logic. FIG. 14 illustrates that not only are the memories 1332, 1334 coupled to the CL 1372, 1382, but also that I/O devices 1414 are also coupled to the control logic 1372, 1382. Legacy I/O devices 1415 are coupled to the chipset 1390.

Figure 15:
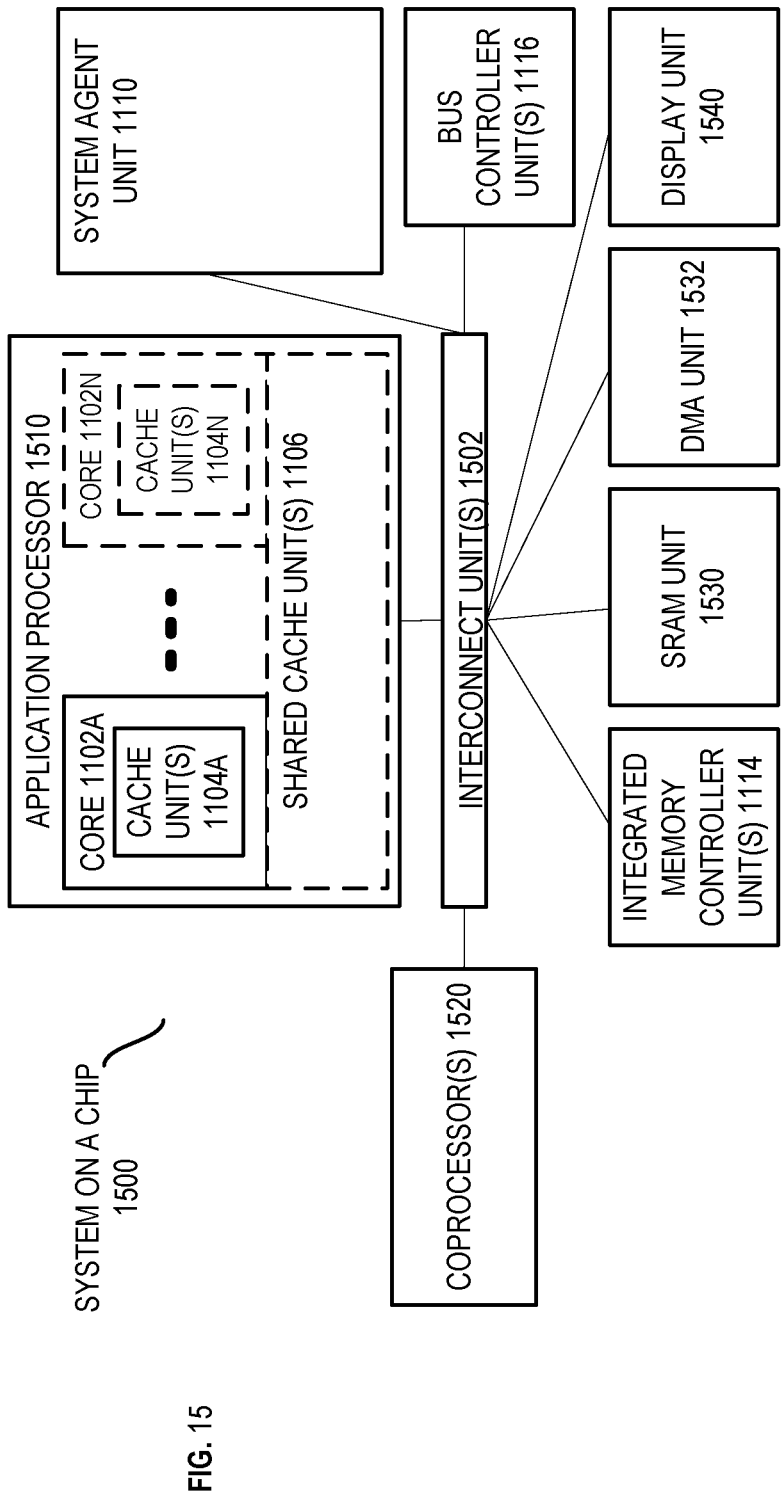

Referring now to FIG. 15, shown is a block diagram of a SoC 1500 in accordance with an embodiment of the present invention. Similar elements in FIG. 11 bear like reference numerals. Also, dashed lined boxes are optional features on more advanced SoCs. In FIG. 15, an interconnect unit(s) 1502 is coupled to: an application processor 1510 which includes a set of one or more cores 202A-N and shared cache unit(s) 1106; a system agent unit 1110; a bus controller unit(s) 1116; an integrated memory controller unit(s) 1114; a set or one or more coprocessors 1520 which may include integrated graphics logic, an image processor, an audio processor, and a video processor; an static random access memory (SRAM) unit 1530; a direct memory access (DMA) unit 1532; and a display unit 1540 for coupling to one or more external displays. In one embodiment, the coprocessor(s) 1520 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1330 illustrated in FIG. 13, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 16 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 16 shows a program in a high level language 1602 may be compiled using an x86 compiler 1604 to generate x86 binary code 1606 that may be natively executed by a processor with at least one x86 instruction set core 1616. The processor with at least one x86 instruction set core 1616 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1604 represents a compiler that is operable to generate x86 binary code 1606 (e.g., object code) that can, with or without additional linkage processing, be executed on the processor with at least one x86 instruction set core 1616. Similarly, FIG. 16 shows the program in the high level language 1602 may be compiled using an alternative instruction set compiler 1608 to generate alternative instruction set binary code 1610 that may be natively executed by a processor without at least one x86 instruction set core 1614 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1612 is used to convert the x86 binary code 1606 into code that may be natively executed by the processor without an x86 instruction set core 1614. This converted code is not likely to be the same as the alternative instruction set binary code 1610 because an instruction converter capable of this is difficult to make; however, the converted code will accomplish the general operation and be made up of instructions from the alternative instruction set. Thus, the instruction converter 1612 represents software, firmware, hardware, or a combination thereof that, through emulation, simulation or any other process, allows a processor or other electronic device that does not have an x86 instruction set processor or core to execute the x86 binary code 1606.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices.

As used in any embodiment herein, the terms "circuit" and "circuitry" may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods of implementing an analog neural network using a pipelined SRAM architecture ("PISA") circuitry disposed in on-chip processor memory circuitry. The on-chip processor memory circuitry may include processor last level cache (LLC) circuitry. One or more physical parameters, such as a stored charge or voltage, may be used to permit the generation of an in-memory analog output using a SRAM array. The generation of an in-memory analog output using only word-line and bit-line capabilities beneficially increases the computational density of the PISA circuit without increasing power requirements. Thus, the systems and methods described herein beneficially leverage the existing capabilities of on-chip SRAM processor memory circuitry to perform a relatively large number of analog vector/tensor calculations associated with execution of a neural network, such as a recurrent neural network, without burdening the processor circuitry and without significant impact to the processor power requirements.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for implementing an analog neural network using in-memory, mathematical operations performed by a pipelined SRAM architecture ("PISA") circuitry disposed in on-chip processor memory circuitry.

According to example 1, there is provided a system. The system may include: processor circuitry; analog to digital (A/D) conversion circuitry; on-chip processor memory circuitry that includes a plurality of static random access memory (SRAM) circuits, each of the SRAM circuits including microcontroller circuitry; and control circuitry to: form a serially coupled pipelined SRAM architecture (PISA) circuit by serially coupling the SRAM circuits included in the plurality of SRAM circuits, each of the SRAM circuits to determine a single layer of a multi-layer neural network; cause the PISA circuit to generate an analog output that includes a voltage representative of an output of the multi-layer neural network; cause the A/D conversion circuitry to convert the analog output to a digital output representative of the output of the multi-layer neural network; and compare the digital output representative of the output of the multi-layer neural network to one or more threshold values.

Example 2 may include elements of example 1, and the system may further include: control circuitry to: cause an update of state data stored in one or more SRAM circuits with state data associated with a current output of the multi-layer neural network, such that the state data stored in the one or more SRAM circuits includes at least one prior iteration of multi-layer neural network.

Example 3 may include elements of any of examples 1 or 2 where the multi-layer neural network comprises a multi-layer recurrent neural network.

Example 4 may include elements of any of examples 1 through 3, and the system may further include: cause at least one multiplication operation that includes data representative of a current state and data representative of a first weight factor array; and cause at least one multiplication operation that includes data representative of a prior state with data representative of a second weight factor array to generate the analog output that includes the voltage representative of the output of the multi-layer neural network.

Example 5 may include elements of any of examples 1 through 4, and the system may further include: control circuitry to cause the A/D conversion circuitry to convert the analog output to at least a 2-bit digital output representative of the output of the multi-layer neural network.

According to example 6, there is provided a method. The method may include: forming, by control circuitry, a serially coupled pipelined SRAM architecture (PISA) circuit by serially coupling a plurality of SRAM circuits included in on-chip processor cache circuitry, each of the SRAM circuits to provide an output representative of a single layer of a multi-layer neural network; causing, by the control circuitry, the PISA circuit to generate an analog output that includes a voltage representative of an output of the multi-layer neural network; causing, by the control circuitry, an analog to digital (A/D) conversion circuit to convert the analog output to a digital output representative of the output of the multi-layer neural network; and causing, by the control circuitry, a comparison of the digital output representative of the output of the multi-layer neural network to one or more threshold values.

Example 7 may include elements of example 6, and the method may further include: causing, by control circuitry, a replacement of prior state data stored in at least one of the plurality of SRAM circuits with current state data associated with a current output of the multi-layer neural network, such that the at least one of the plurality of SRAM circuits stores current state data based on at least one prior iteration of the multi-layer neural network.

Example 8 may include elements of any of examples 6 or 7 where forming the serially coupled pipelined SRAM architecture (PISA) circuit by serially coupling the plurality of SRAM circuits included in the on-chip processor cache circuitry may include: forming the serially coupled pipelined SRAM architecture (PISA) circuit by serially coupling the plurality of SRAM circuits included in the on-chip processor cache circuitry to provide a multi-layer recurrent neural network.

Example 9 may include elements of any of examples 6 through 8, and the method may further include: causing, by control circuitry, at least one multiplication operation that includes data representative of a current state and data representative of a first weight factor array; and causing, by control circuitry, at least one multiplication operation that includes data representative of a prior state with data representative of a second weight factor array to generate the analog output that includes the voltage representative of the output of the multi-layer neural network.

Example 10 may include elements of any of examples 6 through 9 where causing the analog to digital (A/D) conversion circuit to convert the analog output to the digital output representative of the output of the multi-layer neural network may further include: causing the analog to digital (A/D) conversion circuit to convert the analog output to at least a 2-bit digital output representative of the output of the multi-layer neural network.

According to example 11, there is provided a system to execute an analog neural network in SRAM on-chip processor memory circuitry. The system may include: means for forming a serially coupled pipelined SRAM architecture (PISA) circuit by serially coupling a plurality of SRAM circuits included in on-chip processor cache circuitry, each of the SRAM circuits to provide an output representative of a single layer of a multi-layer neural network; means for causing the PISA circuit to generate an analog output that includes a voltage representative of an output of the multi-layer neural network; means for converting the analog output to a digital output representative of the output of the multi-layer neural network; and means comparing of the digital output representative of the output of the multi-layer neural network to one or more threshold values.

Example 12 may include elements of any of example 11, and the system may further include: means replacing prior state data stored in at least one of the plurality of SRAM circuits with current state data associated with a current output of the multi-layer neural network, such that the at least one of the plurality of SRAM circuits stores current state data based on at least one prior iteration of the multi-layer neural network.

Example 13 may include elements of any of examples 11 or 12 where the means for forming the serially coupled pipelined SRAM architecture (PISA) circuit by serially coupling the plurality of SRAM circuits included in the on-chip processor cache circuitry may include: means for serially coupling the plurality of SRAM circuits included in the on-chip processor cache circuitry to provide a multi-layer recurrent neural network.

Example 14 may include elements of any of examples 11 through 13, and the system may further include: means for causing at least one multiplication operation that includes data representative of a current state and data representative of a first weight factor array; and means for causing at least one multiplication operation that includes data representative of a prior state with data representative of a second weight factor array to generate the analog output that includes the voltage representative of the output of the multi-layer neural network.

Example 15 may include elements of any of examples 11 through 14 where the means for converting the analog output to the digital output representative of the output of the multi-layer neural network may further include: means for converting the analog output to at least a 2-bit digital output representative of the output of the multi-layer neural network.

According to example 16, there is provided a non-transitory machine-readable storage medium that includes instructions. The instructions, when executed by a control circuit cause the control circuit to: form a serially coupled pipelined SRAM architecture (PISA) circuit by serially coupling the SRAM circuits included in the plurality of SRAM circuits, each of the SRAM circuits to determine a single layer of a multi-layer neural network; cause the PISA circuit to generate an analog output that includes a voltage representative of an output of the multi-layer neural network; cause the A/D conversion circuitry to convert the analog output to a digital output representative of the output of the multi-layer neural network; and compare the digital output representative of the output of the multi-layer neural network to one or more threshold values.

Example 17 may include elements of example 16 and the non-transitory machine-readable storage medium may further include instructions that, when executed by the control circuit, cause the control circuit to: cause an update of state data stored in one or more SRAM circuits with state data associated with a current output of the multi-layer neural network, such that the state data stored in the one or more SRAM circuits includes at least one prior iteration of multi-layer neural network.

Example 18 may include elements of any of examples 16 or 17 where the instructions that cause the control circuit to form a serially coupled pipelined SRAM architecture (PISA) circuit by serially coupling the SRAM circuits may further cause the control circuit to: form the serially coupled pipelined SRAM architecture (PISA) circuit by serially coupling the SRAM circuits to provide a multi-layer recurrent neural network.

Example 19 may include elements of any of examples 16 through 18 and the non-transitory machine-readable storage medium may further include instructions that, when executed by the control circuit, cause the control circuit to: cause at least one multiplication operation that includes data representative of a current state and data representative of a first weight factor array; and cause at least one multiplication operation that includes data representative of a prior state with data representative of a second weight factor array to generate the analog output that includes the voltage representative of the output of the multi-layer neural network.

Example 20 may include elements of any of examples 16 through 19 where the instructions that cause the control circuit to cause the A/D conversion circuitry to convert the analog output to a digital output representative of the output of the multi-layer neural network may further cause the control circuit to: cause the A/D conversion circuitry to convert the analog output to at least a 2-bit digital output representative of the output of the multi-layer neural network.

According to example 21, there is provided an electronic device. The electronic device may include: a circuit board; a processor circuit coupled to the circuit board; a system memory circuit coupled to the circuit board and communicably coupled to the processor circuit; analog to digital (A/D) conversion circuitry; on-chip processor memory circuitry that includes a plurality of static random access memory (SRAM) circuits, each of the SRAM circuits including microcontroller circuitry; and control circuitry to: form a serially coupled pipelined SRAM architecture (PISA) circuit by serially coupling the SRAM circuits included in the plurality of SRAM circuits, each of the SRAM circuits to determine a single layer of a multi-layer neural network; cause the PISA circuit to generate an analog output that includes a voltage representative of an output of the multi-layer neural network; cause the A/D conversion circuitry to convert the analog output to a digital output representative of the output of the multi-layer neural network; and compare the digital output representative of the output of the multi-layer neural network to one or more threshold values.

Example 22 may include elements of example 21, and the electronic device may additionally include control circuitry to: cause an update of state data stored in one or more SRAM circuits with state data associated with a current output of the multi-layer neural network, such that the state data stored in the one or more SRAM circuits includes at least one prior iteration of multi-layer neural network.

Example 23 may include elements of any of examples 21 and 22 where the multi-layer neural network may include a multi-layer recurrent neural network.

Example 24 may include elements of any of examples 21 through 23, and the electronic device may further include control circuitry to: cause at least one multiplication operation that includes data representative of a current state and data representative of a first weight factor array; and cause at least one multiplication operation that includes data representative of a prior state with data representative of a second weight factor array to generate the analog output that includes the voltage representative of the output of the multi-layer neural network.

Example 25 may include elements of any of examples 21 through 24, and the electronic device may further include control circuitry to: cause the A/D conversion circuitry to convert the analog output to at least a 2-bit digital output representative of the output of the multi-layer neural network.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed:

1. A system comprising:
   processor circuitry;
   analog to digital (A/D) conversion circuitry;
   on-chip processor memory circuitry that includes a plurality of static random access memory (SRAM) circuits, each of the SRAM circuits including microcontroller circuitry; and
   control circuitry to:
     form a serially coupled pipelined SRAM architecture (PISA) circuit by serially coupling the SRAM circuits included in the plurality of SRAM circuits, each of the SRAM circuits to determine a single layer of a multi-layer neural network;
     cause the PISA circuit to generate an analog output that includes a voltage representative of an output of the multi-layer neural network;
     cause the A/D conversion circuitry to convert the analog output to a digital output representative of the output of the multi-layer neural network; and
     compare the digital output representative of the output of the multi-layer neural network to one or more threshold values.

2. The system of claim 1, further comprising:
   the control circuitry to:
     cause an update of state data stored in one or more SRAM circuits with state data associated with a current output of the multi-layer neural network, such that the state data stored in the one or more SRAM circuits includes at least one prior iteration of multi-layer neural network.

3. The system of claim 2 wherein the multi-layer neural network comprises a multi-layer recurrent neural network.

4. The system of claim 1, further comprising the control circuitry to:
   cause at least one multiplication operation that includes data representative of a current state and data representative of a first weight factor array; and
   cause at least one multiplication operation that includes data representative of a prior state with data representative of a second weight factor array to generate the analog output that includes the voltage representative of the output of the multi-layer neural network.

5. The system of claim 1, further comprising the control circuitry to:
   cause the A/D conversion circuitry to convert the analog output to at least a 2-bit digital output representative of the output of the multi-layer neural network.

6. A method, comprising:
   forming, by control circuitry, a serially coupled pipelined SRAM architecture (PISA) circuit by serially coupling a plurality of SRAM circuits, each of the SRAM circuits to provide an output representative of a single layer of a multi-layer neural network;

causing, by the control circuitry, the PISA circuit to generate an analog output that includes a voltage representative of an output of the multi-layer neural network;
causing, by the control circuitry, an analog to digital (A/D) conversion circuit to convert the analog output to a digital output representative of the output of the multi-layer neural network; and
causing, by the control circuitry, a comparison of the digital output representative of the output of the multi-layer neural network to one or more threshold values.

7. The method of claim 6, further comprising:
   causing, by the control circuitry, a replacement of prior state data stored in at least one of the plurality of SRAM circuits with current state data associated with a current output of the multi-layer neural network, such that the at least one of the plurality of SRAM circuits stores the current state data based on at least one prior iteration of the multi-layer neural network.

8. The method of claim 7 wherein forming the serially coupled pipelined SRAM architecture (PISA) circuit by serially coupling the plurality of SRAM circuits comprises:
   forming the serially coupled pipelined SRAM architecture (PISA) circuit by serially coupling the plurality of SRAM circuits to provide a multi-layer recurrent neural network.

9. The method of claim 6, further comprising:
   causing, by the control circuitry, at least one multiplication operation that includes data representative of a current state and data representative of a first weight factor array; and
   causing, by the control circuitry, at least one multiplication operation that includes data representative of a prior state with data representative of a second weight factor array to generate the analog output that includes the voltage representative of the output of the multi-layer neural network.

10. The method of claim 6, wherein causing the analog to digital (A/D) conversion circuit to convert the analog output to the digital output representative of the output of the multi-layer neural network further comprises:
    causing the analog to digital (A/D) conversion circuit to convert the analog output to at least a 2-bit digital output representative of the output of the multi-layer neural network.

11. A system, comprising:
    means for forming a serially coupled pipelined SRAM architecture (PISA) circuit by serially coupling a plurality of SRAM circuits, each of the SRAM circuits to provide an output representative of a single layer of a multi-layer neural network;
    means for causing the PISA circuit to generate an analog output that includes a voltage representative of an output of the multi-layer neural network;
    means for converting the analog output to a digital output representative of the output of the multi-layer neural network; and
    means for comparing of the digital output representative of the output of the multi-layer neural network to one or more threshold values.

12. The system of claim 11, further comprising:
    means for replacing prior state data stored in at least one of the plurality of SRAM circuits with the current state data associated with a current output of the multi-layer neural network, such that the at least one of the plurality of SRAM circuits stores current state data based on at least one prior iteration of the multi-layer neural network.

13. The system of claim 12 wherein the means for forming the serially coupled pipelined SRAM architecture (PISA) circuit by serially coupling the plurality of SRAM circuits comprises:
means for serially coupling the plurality of SRAM circuits to provide a multi-layer recurrent neural network.

14. The system of claim 11, further comprising:
means for causing at least one multiplication operation that includes data representative of a current state and data representative of a first weight factor array; and
means for causing at least one multiplication operation that includes data representative of a prior state with data representative of a second weight factor array to generate the analog output that includes the voltage representative of the output of the multi-layer neural network.

15. The system of claim 11, wherein the means for converting the analog output to the digital output representative of the output of the multi-layer neural network further comprises:
means for converting the analog output to at least a 2-bit digital output representative of the output of the multi-layer neural network.

16. A non-transitory machine-readable storage medium that comprising instructions that, when executed by a control circuit, cause the control circuit to:
form a serially coupled pipelined SRAM architecture (PISA) circuit by serially coupling SRAM circuits included in a plurality of SRAM circuits, each of the SRAM circuits to determine a single layer of a multi-layer neural network;
cause the PISA circuit to generate an analog output that includes a voltage representative of an output of the multi-layer neural network;
cause analog to digital (A/D) conversion circuitry to convert the analog output to a digital output representative of the output of the multi-layer neural network; and
compare the digital output representative of the output of the multi-layer neural network to one or more threshold values.

17. The non-transitory machine-readable storage medium of claim 16 further comprising instructions that, when executed by the control circuit, cause the control circuit to:
cause an update of state data stored in one or more SRAM circuits with state data associated with a current output of the multi-layer neural network, such that the state data stored in the one or more SRAM circuits includes at least one prior iteration of multi-layer neural network.

18. The non-transitory machine-readable storage medium of claim 17 wherein the instructions that cause the control circuit to form a serially coupled pipelined SRAM architecture (PISA) circuit by serially coupling the SRAM circuits further cause the control circuit to:
form the serially coupled pipelined SRAM architecture (PISA) circuit by serially coupling the SRAM circuits to provide a multi-layer recurrent neural network.

19. The non-transitory machine-readable storage medium of claim 16 further comprising instructions that, when executed by the control circuit, cause the control circuit to:
cause at least one multiplication operation that includes data representative of a current state and data representative of a first weight factor array; and cause at least one multiplication operation that includes data representative of a prior state with data representative of a second weight factor array to generate the analog output that includes the voltage representative of the output of the multi-layer neural network.

20. The non-transitory machine-readable storage medium of claim 17 wherein the instructions that cause the control circuit to cause the A/D conversion circuitry to convert the analog output to a digital output representative of the output of the multi-layer neural network further cause the control circuit to:
cause the A/D conversion circuitry to convert the analog output to at least a 2-bit digital output representative of the output of the multi-layer neural network.

21. An electronic device comprising:
a circuit board;
a processor circuit coupled to the circuit board;
a system memory circuit coupled to the circuit board and communicably coupled to the processor circuit;
analog to digital (A/D) conversion circuitry;
on-chip processor memory circuitry that includes a plurality of static random access memory (SRAM) circuits, each of the SRAM circuits including microcontroller circuitry; and
control circuitry to:
form a serially coupled pipelined SRAM architecture (PISA) circuit by serially coupling the SRAM circuits included in the plurality of SRAM circuits, each of the SRAM circuits to determine a single layer of a multi-layer neural network;
cause the PISA circuit to generate an analog output that includes a voltage representative of an output of the multi-layer neural network;
cause the A/D conversion circuitry to convert the analog output to a digital output representative of the output of the multi-layer neural network; and
compare the digital output representative of the output of the multi-layer neural network to one or more threshold values.

22. The electronic device of claim 21, further comprising: the control circuitry to:
cause an update of state data stored in one or more SRAM circuits with state data associated with a current output of the multi-layer neural network, such that the state data stored in the one or more SRAM circuits includes at least one prior iteration of multi-layer neural network.

23. The electronic device of claim 22 wherein the multi-layer neural network comprises a multi-layer recurrent neural network.

24. The electronic device of claim 21, further comprising the control circuitry to:
cause at least one multiplication operation that includes data representative of a current state and data representative of a first weight factor array; and
cause at least one multiplication operation that includes data representative of a prior state with data representative of a second weight factor array to generate the analog output that includes the voltage representative of the output of the multi-layer neural network.

25. The electronic device of claim 21, further comprising the control circuitry to:
cause the A/D conversion circuitry to convert the analog output to at least a 2-bit digital output representative of the output of the multi-layer neural network.

* * * * *